United States Patent [19]

Kumanoya et al.

[11] Patent Number: 4,933,907
[45] Date of Patent: Jun. 12, 1990

[54] DYNAMIC RANDOM ACCESS MEMORY DEVICE AND OPERATING METHOD THEREFOR

[75] Inventors: Masaki Kumanoya; Katsumi Dosaka; Yasuhiro Konishi; Hiroyuki Yamasaki; Takahiro Komatsu; Yoichi Tobita, all of Hyogo, Japan

[73] Assignee: Mitsubishi Denki Kabushiki Kaisha, Tokyo, Japan

[21] Appl. No.: 278,552

[22] Filed: Dec. 1, 1988

[30] Foreign Application Priority Data

Dec. 3, 1987 [JP] Japan ............................... 62-308062
Dec. 16, 1987 [JP] Japan ............................... 62-319578
Sep. 1, 1988 [JP] Japan ............................... 63-221108

[51] Int. Cl.$^5$ ............................................. G11C 11/34
[52] U.S. Cl. ................................. 365/222; 365/230.03
[58] Field of Search ........................... 365/222, 230.03

[56] References Cited

U.S. PATENT DOCUMENTS 4,653,030 3/1987 Tachibana et al. ................. 365/222

FOREIGN PATENT DOCUMENTS 26897 2/1988 Japan .

OTHER PUBLICATIONS

Shozo Saito et al., "A 1Mb CMOS DRAM with Fast Page and Static Column Modes" ISSCC 85, Feb. 15, 1985, pp. 252-253.
Michiro Yamada et al., "A 64Kbit Dynamic RAM with Auto/Self Refresh Functions". Electronics and Communications in Japan, vol. 66-C, No. 1, 1983, pp. 103-110.

Primary Examiner—Joseph A. Popek
Attorney, Agent, or Firm—Lowe, Price, Leblanc, Becker & Shur

[57] ABSTRACT

A dynamic random access memory having a self-refresh mode comprises a memory array partitioned into four groups in which control are respectively performed and a partial activation control circuit. The four groups in the memory array are alternately refreshed two by two in an operation under the self-refresh mode. As a result, each group in the memory array is refreshed at a time interval of two times a conventional refresh interval, so that the power consumption is decreased.

19 Claims, 19 Drawing Sheets

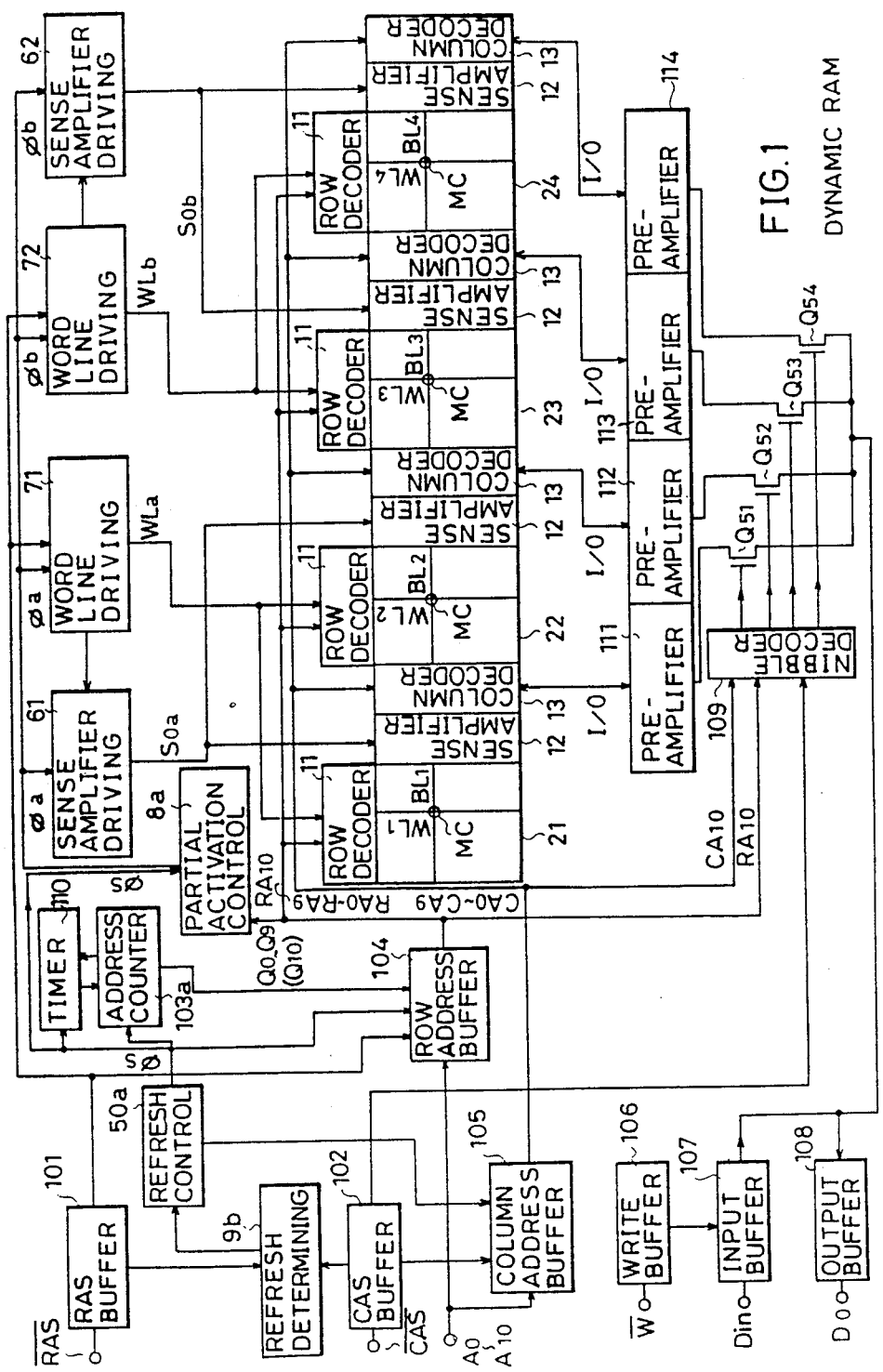
FIG.1 DYNAMIC RAM

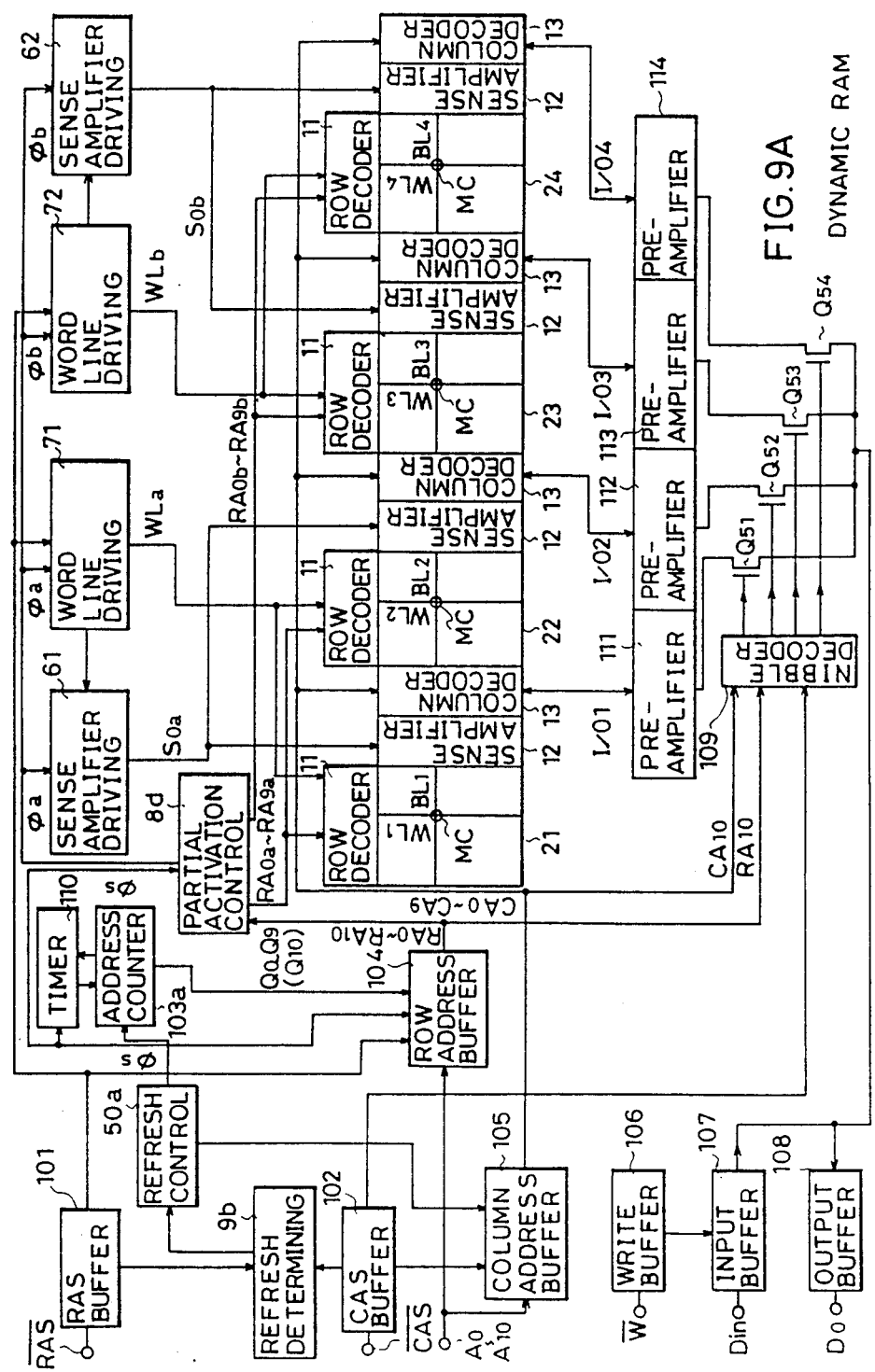
FIG. 9A DYNAMIC RAM

DETECTION OF READ OR WRITE MODE

DETECTION OF $\overline{CAS}$ BEFORE $\overline{RAS}$ REFRESH MODE

DETECTION OF SELF-REFRESH MODE

DYNAMIC RANDOM ACCESS MEMORY DEVICE AND OPERATING METHOD THEREFOR

BACKGROUND OF THE INVENTION

1. Field of the Invention

The present invention relates generally to dynamic random access memory devices, and more particularly, to a dynamic random access memory device having a self-refresh mode which automatically initiates a periodical refresh operation.

2. Background Art

In recent years, personal computers have been significantly used generally. In particular, recently, the demand for portable personal computers has been increased. Such a personal computer requires a memory device having low power consumption the power supply of which is backed up by a battery. As a memory device for such a use, a static random access memory or a dynamic random access memory (referred to as DRAM hereinafter) have been employed.

In the DRAM, each memory cell generally comprises a single transistor and a single capacitor. This is referred to as a so-called a single transistor/a single capacitor type memory cell, which is suitable for decrease in the area of a cell and high integration density.

FIG. 12 is a block diagram showing a conventional 1-megabit DRAM. In FIG. 12, this DRAM comprises memory arrays 21 to 24 each comprising a memory cell MC for storing a data signal, row decoders 11, column decoders 13 and sense amplifiers 12, each of the row decoders 11, each of the column decoders 13 and each of the sense amplifiers being connected to each of the memory arrays 21 to 24 to constitute each memory array block, a word line driving circuit 70 connected to each of the row decoders 11, a sense amplifier driving circuit 60 connected to each of the sense amplifiers 12, and pre-amplifiers 111 to 114 each for amplifying the data signal as read out. In addition, this DRAM is provided with a RAS buffer 101 receiving a row address strobe (referred to as $\overline{RAS}$ hereinafter) signal from the exterior, a CAS buffer 102 receiving a column address strobe (referred to as $\overline{CAS}$ hereinafter) signal, a row address buffer 104 for receiving row address signals $RA_0$ to $RA_9$, a column address buffer 105 for receiving column address signals $CA_0$ to $CA_9$, a write buffer 106 receiving a write control signal $\overline{W}$, an input buffer 107 receiving an input data signal Din, and an output buffer 108 temporarily holding an output data signal Do. There is provided a refresh determining circuit 9a for determining a refresh mode between the RAS buffer 101 and the CAS buffer 102. The refresh determining circuit 9a has its output connected to a refresh control circuit 50a for controlling a refresh operation. An address counter 103 is provided for generating in the internal address signals $Q_0$ to $Q_8$ for refreshing.

Operations will be briefly described. First, the row and column address signals $RA_0$ to $RA_9$ and $CA_0$ to $CA_9$ are applied to this DRAM through an address input terminal. Each of the address signals is held in the row address buffer 104 and the column address buffer 105 in response to timings of the falling edges of the $\overline{RAS}$ and $\overline{CAS}$ signals. Then, a word line is selected in each of the row decoders 11 in response to the row address signals $RA_0$ to $RA_8$. A word line driving signal WL is outputted to each of the row decoders 11 from the word line driving circuit 70, so that the word line connected to the signal WL is activated.

Thereafter, for example, in a reading operation, a signal stored in the memory cell MC is applied to a bit line BL1. This signal is amplified by the sense amplifier 12 and then, selected by the column decoder 13, thereby to be applied to a read/write line $I/O_1$. By the foregoing operations, signals read out from the four memory arrays 21 to 24 are respectively applied to write/read lines $I/O_1$ to $I/O_4$. The pre-amplifiers 111 to 114 further amplify the signals, respectively.

In a nibble mode, a nibble decoder 109 is operated as a shift register, so that a 4-bit data signal read out by toggling the $\overline{CAS}$ signal is sequentially transferred to the output buffer 108 through transistors $Q_{51}$ to $Q_{54}$ at high speed. In an ordinary mode excluding the nibble mode, the nibble decoder 109 is operated as a decoder for decoding most significant address signals $RA_9$ and $CA_9$, so that a data signal of one bit out of four bits is transferred to the output buffer 108 through the transistors $Q_{51}$ to $Q_{54}$ in response to the decoded signals.

Contrary to this, in a writing operation, the input data signal Din is written into the memory cells MC through the read/write lines $I/O_1$ to $I/O_4$.

FIG. 13A is a circuit diagram showing an example of a specific circuit in each of the memory array blocks shown in FIG. 12, and FIG. 13B is a timing chart for explaining the operation. The figures are described in Digest of Technical Papers of IEEE International Solid-State Circuits Conference held in 1985, pp. 252–253.

Referring to FIG. 13A, this memory array block comprises a memory array and a sense amplifier which handle a 256K-bit data signal. Therefore, there are provided 512 word lines WL1 to WL512 connected to a row decoder, 512 bit line pairs BL1 and $\overline{BL1}$ to BL512 and $\overline{BL512}$ each connected to the sense amplifier 2 being provided in a direction intersecting therewith. In addition, output lines Y1 to Y512 of a column decoder are connected to each column.

For example, in a column 5 including the bit lines BL1 and $\overline{BL1}$, a memory cell MC is connected between the bit line BL1 and the word line WL1. The memory cell MC comprises an NMOS transistor $Q_0$ for switching and a capacitor $C_0$ for storing a signal. The capacitor $C_0$ has one electrode connected to receive a constant voltage Vcp (for example, a voltage of one-half of a power-supply voltage Vcc) generated within a chip. The sense amplifier 2 comprises an N channel flip-flop comprising NMOS transistors $Q_1$ and $Q_2$ and a P channel flip-flop comprising PMOS transistors $Q_3$ and $Q_4$. The transistors $Q_3$ and $Q_4$ have their sources integrally connected to a common source line SP, and the transistors $Q_1$ and $Q_2$ have their sources integrally connected to a common source line SN. A gate circuit 3 comprises NMOS transistors $Q_5$ and $Q_6$ each connected between the bit lines BL1 and $\overline{BL1}$ and lines I/0 and $\overline{I/0}$. The transistors $Q_5$ and $Q_6$ have their gates connected to the output line Y1 of the column decoder. A bit line equalizing and holding circuit 4 comprises NMOS transistors $Q_7$ to $Q_9$ integrally connected to each other such that gates thereof receive an equalize signal EQ. The bit lines BL1 and $\overline{BL1}$ are connected to receive a bit line precharging voltage $V_{BL}$ ($\frac{1}{2}$Vcc) through this circuit 4. When the $\overline{RAS}$ signal is at a high level (in a standby state), the voltage $V_{BL}$ is applied to the bit lines BL1 and $\overline{BL1}$.

There are provided a total of 512 columns 5 of various circuits connected to the above described bit line pair. In the above described manner, a total of 262,144-bit (256K) memory array blocks are structured.

A sense amplifier activating circuit 6 comprises a PMOS transistor $Q_{11}$ connected between a power supply Vcc and a common source line SP and an NMOS transistor $Q_{10}$ connected between ground and a common source line SN. The transistors $Q_{10}$ and $Q_{11}$ have their gates respectively connected to receive signals So and $\overline{So}$ from the sense amplifier driving circuit 60.

Referring now to FIGS. 13A and 13B, operations will be described.

The equalize signal EQ is almost synchronized with the external $\overline{RAS}$ signal. This signal EQ is at a high level before a time tl, so that the DRAM is brought to a state in which the $\overline{RAS}$ signal is at a high level, i.e., a standby state. In this state, the transistors $Q_7$ to $Q_9$ are turned on, so that all the bit line pairs BL1 to BL512 are brought to ½ Vcc. One of the bit line pair is brought to a power-supply Vcc level and the other thereof is brought to a ground level in the previous operation cycle and then, the transistor $Q_7$ is turned on at the time of determination of the cycle, so that this voltage becomes ½ Vcc. Thus, a voltage of ½ Vcc need not be supplied from the power supply $V_{BL}$. However, when the standby state lasts for a long time, the voltage $V_{BL}$ is supplied for the purpose of preventing a voltage on the bit line pair from being fluctuated by some noises. More specifically, the voltage $V_{BL}$ is applied to the bit line pair through the transistors $Q_8$ and $Q_9$ in order to hold the bit line pair at a $V_{BL}$ level rather than to supply the voltage to the bit line pair.

First, in the reading operation, at about a time tl, the $\overline{RAS}$ signal is changed to a low level, and the signal EQ is also changed to a low level. The transistors $Q_7$ to $Q_9$ are turned off in response to the signal EQ, so that the bit line pair BL1 and $\overline{BL1}$ is rendered electrically floating. On the other hand, at this time, the row address signals to $RA_0$ to $RA_9$ are inputted at timings of the falling edge of the $\overline{RAS}$ signal as described above. The row decoder decodes the signals $RA_0$ to $R_8$, to bring one (for example, WL1) out of 512 word lines WL1 to WL512 into a high level. As shown in FIG. 13A, a total of 512 memory cells each connected to either one of the two bit lines for each column are connected to the word line WL1. The word line WL1 is brought to a high level, so that the transistor $Q_0$ is turned on, whereby a signal stored in each of the memory cells is applied to a bit line. Since the ratio of a capacitance value of the capacitor $C_0$ in the memory cell to a capacitance value of the bit line is approximately 1:10, the change in voltage of approximately one-tenth of the power-supply voltage Vcc appears on the bit line. For example, as shown in FIG. 3A, a voltage on the bit line BL1 is slightly raised. On the other hand, a voltage of the bit line $\overline{BL1}$ remains at ½ Vcc.

At a time t3, the sense amplifier driving signals So and $\overline{So}$ are respectively changed to a high level and a low level. The transistors $Q_{10}$ and $Q_{11}$ are turned on in response to the signals, so that the 512 sense amplifiers 2 are driven. Thus, for example, a very small change in voltage which slightly appeared between the bit lines BL1 and $\overline{BL1}$ is amplified, so that the bit line BL1 is brought to a high level while the bit line $\overline{BL1}$ is brought to a low level. At this time point, voltages of the 512 bit line pairs are changed by the 512 sense amplifiers in response to the data signals stored in the 512 memory cells.

At a time t4, an output signal (for example, a high level signal Y1) for selecting one of the 512 bit line pairs is outputted from the column decoder. The transistors $Q_5$ and $Q_6$ are turned on in response to the signal Y1, so that the amplified data signal is applied to the read/write line pair I/0 and $\overline{I/0}$. This read/write line pair has been brought to a floating state in advance, the level thereof being changed depending on the level of the signal from the bit line pair.

At a time t5, a voltage of the word line WL1 is changed to a low level, so that each of the memory cells connected to this word line WL1 and each of the bit lines are electrically disconnected. In addition, at a time t6, the sense amplifier driving signals So and $\overline{So}$ are respectively changed to a low level and a high level, so that the equalize signal EQ is changed to a high level. Consequently, all the bit line pairs are brought to a ½ Vcc level, so that the DRAM is brought to a standby state in preparation for the next cycle. In the foregoing, one operation cycle is terminated.

Meanwhile, the level of voltages of bit lines amplified in a period from the time t3 to time t5 is rewritten to all the memory cells connected to the word line WL1 by the voltages thereof. In addition, the change in voltage represented by a dotted line in FIG. 13B corresponds to a case in which a data signal of a level opposite to that in the above described case is stored in a memory cell.

Then, in the writing operation, the read/write line pair I/0 and $\overline{I/0}$ is brought to the level of a data signal to be written in response to the input data signal inputted to the input buffer 107. This data signal is applied to a bit line pair selected by the column decoder after the time t4, to be stored in a memory cell connected to a word line which was brought to a high level.

FIG. 13C is a cross sectional view showing a structure of a planar capacitor type memory cell employed in the conventional DRAM. Referring to FIG. 13C, an NMOS transistor $Q_0$ and a capacitor $C_0$ for constituting a memory cell are formed on a P-type semiconductor substrate 301. The transistor $Q_0$ has its source and drain formed in N+impurity regions 304 and 305 provided in the substrate 301. The transistor $Q_0$ has its gate 308 formed on the substrate 301 through an insulating film 306. The capacitor $C_0$ has one electrode formed of an impurity diffused layer 303 formed in the vicinity of a main surface of the substrate 301 and another electrode formed of a cell plate 307 of polysilicon (polycrystalline silicon) provided on the layer 303 through an insulating film 312. An insulating film 302 is provided for isolating adjacent memory cells. An N+impurity region 305 is connected to a bit line (not shown) of polysilicon, and the gate 308 is connected to a word line (not shown) of polysilicon.

A data signal to be stored in a memory cell is held in the capacitor $C_0$. More specifically, signal charges are charged between the impurity diffused layer 303 and the cell plate 307 by the data signal. However, a leak current flows into the substrate 301 from a junction of the layer 303, the region 304 and the substrate 301, so that the charged signal charges are liable to be gradually lost. This current is referred to as a junction leak current.

The refresh operation will be described.

A memory cell in the DRAM comprises a single transistor and a single capacitor, as described above. Thus, for example, if the DRAM continues to be brought into a standby state for a long time, charges for storing stored in the capacitor are gradually lost by junction leak or the like, as described above. Therefore, stored signals must be read out every given constant time period, to be rewritten. The operation is referred to as refreshing. A mode for executing the refresh operation generally includes the following two modes. First, in a $\overline{RAS}$ only refresh mode, the $\overline{RAS}$ signal and the row address signal are applied from the exterior, so that the refresh operation is performed. Then, in a $\overline{CAS}$ before $\overline{RAS}$ (auto) refresh mode, only $\overline{RAS}$ and $\overline{CAS}$ signals are applied from the exterior, so that the refresh operation is performed using a signal outputted from an address counter in the interior. In the following description, the refresh modes are referred to as an ordinary refresh mode.

The $\overline{CAS}$ before $\overline{RAS}$ refresh operation will be described. When the ordinary reading or writing operation is initiated, it is determined that the $\overline{RAS}$ signal is lowered and then, the $\overline{CAS}$ signal is lowered. On the contrary, when the $\overline{CAS}$ signal is lowered prior to the $\overline{RAS}$ signal, this $\overline{CAS}$ before $\overline{RAS}$ refresh mode is initiated. In order to detect timings at which the $\overline{RAS}$ and $\overline{CAS}$ signals are changed, there is provided the refresh determining circuit 9a shown in FIG. 12. When designation of the $\overline{CAS}$ before $\overline{RAS}$ refresh mode is detected by the circuit 9a, the refresh control circuit 50a initiates an operation of the address counter 103. In addition, the row address buffer 104 receives the signals $Q_0$ to $Q_8$ outputted from the address counter 103 in place of the address signals $A_0$ to $A_9$ externally applied, in response to a signal from the control circuit 50a. The row address signals $RA_0$ to $Ra_8$ for refreshing are outputted from the row address buffer 104. The subsequent operations are almost the same as the above described reading operation except that a data signal read out to a bit line pair is not applied to a read/write line pair.

More specifically, returning to FIG. 13A, one of the 512 word lines is selected, so that the 512 memory cells are connected to the 512 bit line pairs. A data signal applied to each of the bit line pairs from each of the memory cells is amplified by the 512 sense amplifiers 2 and then, rewritten into each of the memory cells. More specifically, in one memory cycle, the 512 memory cells are refreshed. In such a refresh operation, the data signal as read out need not be outputted, so that the column address signal need not be applied.

Such a $\overline{CAS}$ before $\overline{RAS}$ refresh cycle of the $\overline{RAS}$ and $\overline{CAS}$ signals is repeated 512 times, so that the address counter 103 is incremented 512 times. Thus, the 512 word lines (WL1 to WL512 shown in FIG. 13A) are sequentially activated, so that all 256K-bit memory cells are refreshed. Thus, since four memory arrays are provided, a total of 1-megabit memory cells are all refreshed.

In general, it is determined that in the DRAM, the refresh operation is performed for each 16μs on average. More specifically, in a case of 1-megabit DRAM, it is determined in the standard that the refresh operation is performed within about 16μs×512 cycles=about 8ms, which is generally referred to as a refresh time. For reference, following are discussions of the refresh time for each storage capacity. More specifically, the refresh time is 16μs×128=2ms in a 64k-bit DRAM, 16μs×256=4ms in a 256K-bit DRAM, and 16μs×1024=16ms in a 4-megabit DRAM. It is determined that the refresh cycle and the refresh time are increased by two times every time the storage capacity becomes four times.

If and when the DRAM is employed in an equipment having the above described battery backup function, the DRAM continues to be brought to a standby state at the time of backup of a battery. Thus, the refresh operation must be performed every constant time interval. In order to perform the refresh operation in the above described ordinary refresh mode, the $\overline{RAS}$ and $\overline{CAS}$ signals must be controlled (toggled) every one cycle, to be applied. In order to perform the refresh operation in such an ordinary refresh mode at the time of battery backup, there must be provided a circuit for controlling timings of the $\overline{RAS}$ and $\overline{CAS}$ signals and outputting the same. Consequently, the size of the equipment becomes larger and power consumption is increased, which are not preferable.

In order to solve the problems, a DRAM having a self-refresh mode was published, which has been already commercially available. The self-refresh mode is described in, for example, an article by YAMADA et al., entitled "A 64K bit MOS Dynamic RAM is Auto-/Self Refresh Functions", Journal of Institute of Electronics and Communication Engineers of Japan, Vol. J66-C, No. 1, Jan. 1983.

FIG. 14 is a block diagram showing one example of the conventional DRAM having the self-refresh mode. When a high level external $\overline{RAS}$ signal is applied (in a standby state) and an external refresh signal $\overline{REF}$ continuous to be held at a low level during a set time (a maximum of 16μs) or more of a timer, designation of the self-refresh mode is detected by a circuit 91. A refresh control circuit 92 operates a timer 93 in response to this detection. The timer 93 outputs a signal to a refresh address counter 94 through a circuit 92 every a maximum of 16μs. Output signals $Q_0$ to $Q_6$ from the counter 94 are applied to a row decoder 98 through an address switching circuit 95 and an address buffer 96. The row decoder 98 decodes the signals $Q_0$ to $Q_6$, to sequentially select word lines as in the above described ordinary refresh operation, thereby to refresh a data signal in a memory array 97. As long as the signal $\overline{REF}$ continues to be held at a low level, the refresh operation in the self-refresh mode is continued. More specifically, as in the ordinary refresh mode, the refresh operation of 128 cycles is performed every a maximum of 2ms determined in the standard of a 64K-bit DRAM, so that all memory cells are refreshed.

Thus, the self-refresh mode is the same as the above described $\overline{CAS}$ before $\overline{RAS}$ refresh mode except that increment of the address counter 94 is not controlled by a clock signal externally applied but automatically controlled every constant time period by the self-contained timer 93.

As described in the foregoing, since the conventional DRAM having the self-refresh mode can automatically initiate a periodical refresh operation by setting a mode, the adaptation of the conventional DRAM to the equipment having the battery backup function is suitable from a point of view of decreasing power consumption at the time of battery backup. However, the power consumption required for the self-refresh operation itself is the same as the power consumption required for the ordinary refresh operation, which is not suitable for the operation under battery backup.

FIG. 15 is a timing chart for explaining the ordinary refresh operation of the DRAM shown in FIG. 12. In the DRAM shown in FIG. 12, the four memory cell arrays 21 to 24 are simultaneously refreshed in the ordinary refresh operation. More specifically, the four row decoders 11 receive the word line driving signal WL, to simultaneously select sequentially the word lines in the memory arrays 21 to 24. At the same time, the sense amplifier in each of the memory cell arrays 21 to 24 is driven by the sense amplifier driving signal So. The same operation is performed in the self-refresh operation of the DRAM having the self-refresh mode.

In addition, since the memory cell has the capacitor Co having the structure shown in FIG. 13C as described above, the leak current is large. Thus, a refresh cycle can not be set long. More specifically, in the case of not only the ordinary refresh mode but also the self-refresh mode, the refresh operation must be performed at a time interval at which the data signal held in the capacitor Co is not lost. Since the refresh cycle is short under the self-refresh mode of battery backup, a large refresh power is consumed in the DRAM.

An example of the prior art of particular interest in the present invention is shown in Japanese Patent Laying-Open Gazette No. 26897/1988. In this example, a volatile semiconductor memory is disclosed in which the number of word lines selected in a refresh operation is smaller than that selected in a reading or writing operation.

SUMMARY OF THE INVENTION

An object of the present invention is to decrease the power consumption of a dynamic random access memory device required for an operation in a self-refresh mode.

Another object of the present invention is to decrease the power consumption of a dynamic random access memory device required for an operation in a self-refresh mode by a simple change in circuit.

Still another object of the present invention is to increase a refresh interval of a dynamic random access memory device in a self-refresh mode.

A further object of the present invention is to make it difficult to lose a data signal stored in a memory cell in a dynamic random access memory device.

A still further object of the present invention is to decrease a junction leak current from a capacitor in a memory cell in a dynamic random access memory device.

Briefly stated, the dynamic random access memory device according to the present invention comprises a first plurality of memory array blocks each comprising a memory cell for storing a data signal, a circuit for generating a refresh address signal for sequentially refreshing the memory cells in the memory array blocks, and a refresh circuit responsive to the refresh address signal for refreshing the data signals in the memory array blocks. The refresh circuit refreshes the data signals in a second plurality of memory array blocks which is the first plurality of memory array blocks or less when a refresh instructing signal is applied from the exterior. In addition, there are provided a circuit for detecting designation of the self-refresh mode from the exterior, and a block selecting circuit responsive to detection of the self-refresh mode for selecting a third plurality of memory array blocks which is the second plurality of memory array blocks or less. The refresh circuit is responsive to the block selecting circuit for sequentially refreshing the data signals in the third plurality of memory array blocks.

In operation, in the ordinary refresh mode, a refresh operation is performed with respect to the second plurality of memory array blocks. On the other hand, in the self-refresh mode, a refresh operation is first performed with respect to the third plurality of memory array blocks. Subsequently, the refresh operation is performed with respect to the remaining memory array blocks. Since the number of memory array blocks refreshed in the self-refresh operation is smaller than the number in the ordinary refresh operation, the power consumption is decreased.

In a preferred embodiment, the circuit for generating the refresh address signal and the block selecting circuit are structured by an address counter. The address counter outputs a signal having a plurality of bits as a refresh address signal, and outputs a signal of bits added to the refresh address signal as a signal for selecting a block in response to detection of the self-refresh mode. In operation, a signal for selecting a memory array block is obtained by adding bits of the output signal of the address counter. As a result, a circuit for selecting the memory array block is easily obtained.

In accordance with another aspect of the present invention, a method for operating the dynamic random access memory device comprises the steps of generating a refresh address signal for sequentially refreshing memory cells in memory arrays, refreshing data signals in a second plurality of memory array blocks which is a first plurality of memory array blocks or less in response to the refresh address signal when a refresh instructing signal is applied from the exterior, detecting designation of a self-refresh mode from the exterior, selecting a third plurality of memory array blocks which is the second plurality of memory array blocks or less in response to detection of the self-refresh mode, and sequentially refreshing data signals in the selected third plurality of memory array blocks in response to the refresh address signal.

In accordance with still another aspect, the dynamic random access memory device according to the present invention comprises a memory array comprising memory cells for storing data signals, a circuit for generating a refresh address signal for refreshing the memory cells in the memory array, a refresh circuit responsive to the refresh address signal for refreshing the data signals stored in the memory cells at a predetermined time interval, a circuit for detecting external destination of a self-refresh mode, and an interval setting circuit responsive to designation of the self-refresh mode for setting long a refresh interval of the refresh circuit.

In a preferred embodiment, a memory cell comprises a switching element formed on a semiconductor substrate, an insulating layer joined to the semiconductor substrate, a capacitor provided on the semiconductor substrate through the insulating layer, a connecting portion for electrically connecting one end of one electrode of the capacitor and the switching element. Since only one end of the capacitor is joined to the switching element, i.e., the semiconductor substrate through the connecting portion, the emission of charges charged in the capacitor is prevented. As a result, the self refresh interval can be set long, so that the power consumption is decreased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 a block diagram showing a 4-megabit DRAM according to one embodiment of the present invention;

FIG. 9A is a block diagram showing a 4-megabit DRAM according to still another embodiment of the present invention;

FIG. 9B is a circuit diagram showing one example of a partial activation control circuit shown in FIG. 9A;

DESCRIPTION OF THE PREFERRED EMBODIMENTS

Figure 12:
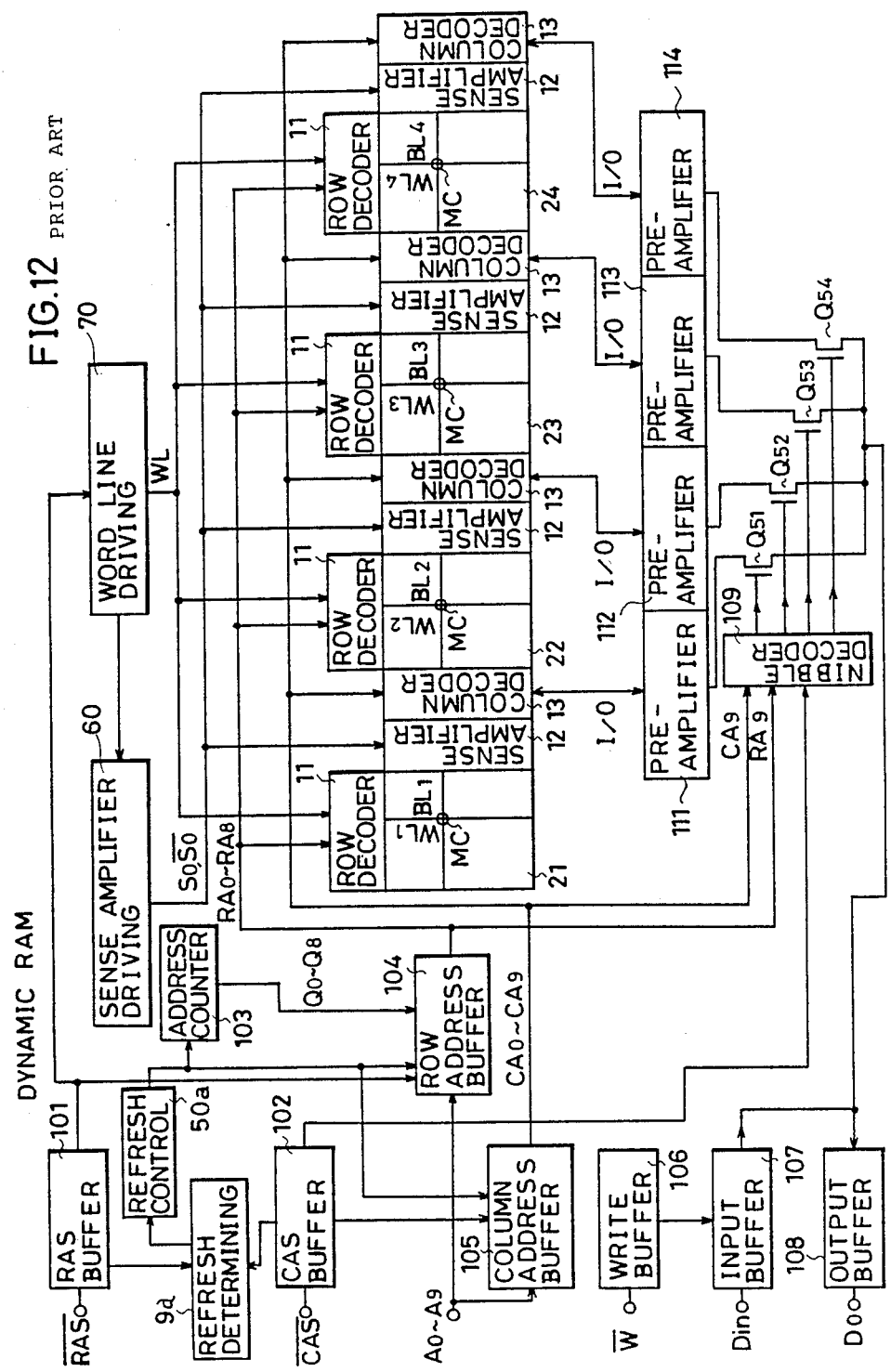
FIG. 12 is a block diagram showing one example of a conventional DRAM.

FIG. 1 is a block diagram showing a 4-megabit DRAM according to one embodiment of the present invention. Referring to FIG. 1, the following is a principal difference from the conventional DRAM shown in FIG. 12. More specifically, in order to achieve 4-megabit storage capacity, there are provided in each of memory arrays 21 to 24 memory cells the number of which is four times that in the conventional DRAM, as well as word lines, bit lines and sense amplifiers the number of which is two times. Therefore, address signals $A_0$ to $A_{10}$ are externally applied.

In addition, in order to decrease the power consumption in a self-refresh operation, there are provided divided word line driving circuits 71 and 72 and divided sense amplifier driving circuits 61 and 62, which are controlled by a partition operation control circuit 8a. In any of reading, writing and ordinary refresh operation, the partial activation control circuit 8a simultaneously operates the word line driving circuits 71 and 72 and the sense amplifier driving circuits 61 and 62, respectively. On the other hand, in the self-refresh operation, the partial activation control circuit 8a alternately operates the circuits 71 and 61 and the circuits 72 and 62 in response to a row address signal $RA_{10}$ obtained from a signal $Q_{10}$ outputted from an address counter 103a.

The address counter 103a outputs signals $Q_0$ to $Q_9$ in a $\overline{CAS}$ before $\overline{RAS}$ refresh operation while outputting signals $Q_0$ to $Q_{10}$ in the self-refresh operation.

Description is now made on operations. Operations other than the operation in the self-refresh mode are basically the same as those of the conventional DRAM shown in FIG. 12. Thus, only the reading operation and the $\overline{CAS}$ before $\overline{RAS}$ refresh operation will be briefly described below.

First, in the reading operation, row address signals $RA_0$ to $RA_{10}$ and column address signals $CA_0$ to $CA_{10}$ are respectively inputted to a row address buffer 104 and a column address buffer 105 from the exterior in response to timings of the falling edges of $\overline{RAS}$ and $\overline{CAS}$ signals. A row decoder 11 connected to each of the memory arrays 21 to 24 sequentially activates 1024 word lines in response to the row address signals $RA_0$ to $RA_9$. One word line is activated, so that data signals stored in 1024 memory cells are applied to 1024 bit line pairs. 1024 sense amplifiers are activated in response to signals Soa and Sob simultaneously outputted from the sense amplifier driving circuits 61 and 62, so that very small voltages applied to the bit line pairs are amplified. A column decoder 13 selects one pair out of the 1024 bit line pairs in response to the column address signals $CA_0$ to $CA_9$. Thus, the data signal stored in each of the memory cells is outputted to a corresponding read/write line I/0 from each of the four memory arrays 21 to 24. The signals applied to the lines I/0 are amplified by preamplifiers 111 to 114 and then, transferred to an output buffer 108 through transistors $Q_{51}$ to $Q_{54}$, respectively.

Then, when the $\overline{CAS}$ signal is changed to a low level prior to the $\overline{RAS}$ signal, designation of a $\overline{RAS}$ before $\overline{CAS}$ refresh mode is determined by a refresh determining circuit 9b. A refresh control circuit 50a inhibits input of the address signals $A_0$ to $A_{10}$ from the exterior in response to this determination, to apply to the row address buffer 104 the output signals $Q_0$ to $Q_9$ from the address counter 103a. The row decoder 11 connected to each of the four memory arrays 21 to 24 sequentially activates the 1024 word lines in response to the row address signals $CA_0$ to $CA_9$ from the row address buffer 104. The data signals stored in the 1024 memory cells connected to each of the word lines are applied to the 1024 bit line pairs. The four sense amplifiers 12 are driven in response to the signals Soa and Sob from the sense amplifier driving circuits 61 and 62, to amplify the signals applied to the bit line pairs. Thus, in one memory array, the stored data signals are rewritten into the 1024 memory cells. This $\overline{CAS}$ before $\overline{RAS}$ refresh operation is repeated 1024 times every 16μs on average, so that 1024×1024×4 (4-megabit) memory cells are all refreshed during approximately 16ms (=16μs×1024).

Description is now made on the operation in the self-refresh mode. Designation of the self-refresh mode is determined by the refresh determining circuit 9b by controlling timings of the $\overline{RAS}$ and $\overline{CAS}$ signals and applying the signals. When the self-refresh mode is designated, the refresh control circuit 50a outputs a high level self-refresh control signal $\phi_s$. Input of the address signals $A_0$ to $A_{10}$ from the exterior is inhibited in response to the signal $\phi_s$ from the refresh control circuit 50a, so that the output signals $Q_0$ to $Q_{10}$ of the address counter 103a are applied to the row address buffer 104. On this occasion, the output signals from the address counter 103a includes the output signal $Q_{10}$ added to the output signals in the case of the above described $\overline{CAS}$ before $\overline{RAS}$ refresh mode. The row address buffer 104 receives the signals $Q_0$ to $Q_{10}$ and outputs the row address signals $RA_0$ to $RA_{10}$.

The partial activation control circuit 8a is 10 responsive to the signal from the row address buffer 104 for driving the word line driving circuit 71 and the sense amplifier driving circuit 61 or the word line driving circuit 72 and the sense amplifier driving circuit 62. More specifically, the circuits 71 and 61 are driven when the signal $RA_{10}$ is "0" while only the circuits 62 and 72 are driven when the signal $RA_{10}$ is "1".

For example, when the signal $RA_{10}$ is "0", the circuits 71 and 61 are driven. In each of the memory arrays 21 to 24, one word line selected by the signals $RA_0$ to $RA_9$ is selected. Since the sense amplifiers connected to the memory arrays 21 and 22 are driven in response to the driving signal Soa from the circuit 61, the signals in the 1024 memory cells connected to the word line are refreshed. On the other hand, the word lines and the sense amplifiers in the memory arrays 23 and 24 are not activated, so that the memory arrays 23 and 24 remain in almost the same state as the standby state. Meanwhile, an equalize signal EQ, which is omitted in FIG. 1, is also controlled by the partial activation control circuit 8a, so that a high level equalize signal EQ is applied to the memory arrays (23 and 24 in this example) which are not operated.

On the contrary, when the signal $RA_{10}$ is "1", the memory arrays 21 and 22 are brought to the standby state, while the refresh operation is performed in the memory arrays 23 and 24.

A timer 110 applies a signal to the address counter 103a every 16μs. The address counter 103a sequentially increments this signal, to output during approximately 16μs (=16μs×1024 cycles) the signals $Q_0$ to $Q_9$ required for selecting all the 1024 word lines. Thus, the time of approximately 16ms is required for refreshing the memory arrays 21 and 22 and subsequently, the time of approximately 16ms is required for refreshing the memory arrays 23 and 24. More specifically, in this self-refresh mode, the time of approximately 32ms is required for refreshing the four memory arrays 21 to 24.

Figure 2A:
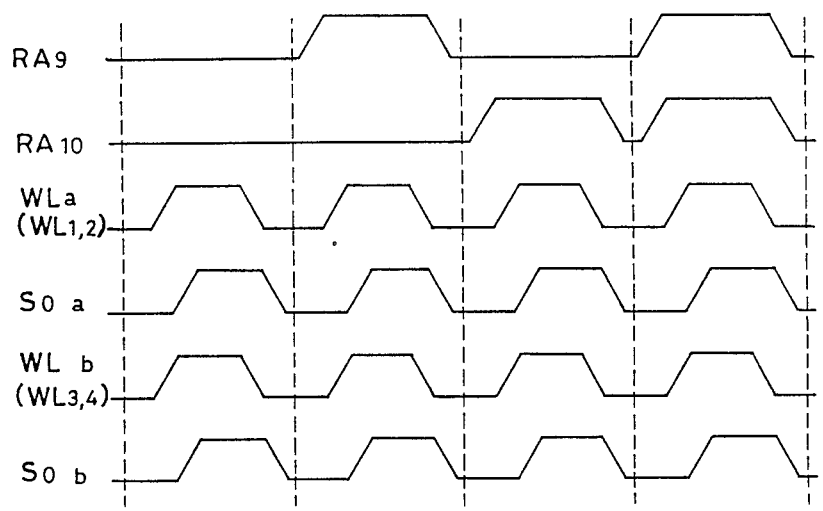
FIGS. 2A and 2B are timing charts for explaining operations in an ordinary refresh mode and a self-refresh mode of the DRAM in FIG. 1, respectively.
Figure 2B:
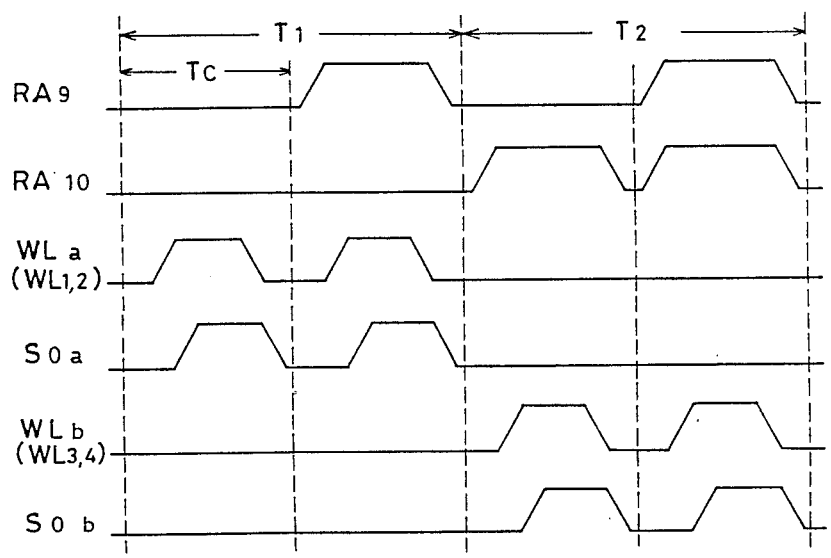

FIGS. 2A and 2B are timing charts showing the difference between operations in the ordinary refresh mode and the self-refresh mode in the DRAM shown in FIG. 1, respectively. Referring to FIG. 2A, in the ordinary ($\overline{CAS}$ before $\overline{RAS}$) refresh operation, driving signals WLa and WLb for driving the respective word lines WL1 to WL4 in all the memory arrays 21 to 24 are simultaneously outputted, and the driving signals Soa and Sob for driving all the sense amplifiers 12 are simultaneously outputted.

On the other hand, referring to FIG. 2B, in the self-refresh mode, the signals WLa and Soa are outputted in a period Tl and subsequently, the signals WLb and Sob are outputted in a period T2. Thus, the data signals in the memory arrays 21 and 22 are refreshed in the period Tl while the data signals in the memory arrays 23 and 24 are refreshed in the period T2.

In the above described example of the operation in the self-refresh mode, the number of memory arrays refreshed per unit time is decreased to one-half, as compared with that in the operation in the ordinary refresh mode. Thus, correspondingly, power consumption is decreased to one-half. Meanwhile, when such a self-refresh mode is applied, the refresh time becomes longer than the time determined in the standard. However, since the ordinary memory cell has the capability of the refresh time of one second or more at room temperature, considerable read margin is obtained.

Although in the above embodiment, description was made on a case in which two of the four memory arrays 21 to 24 are simultaneously operated in the self-refresh operation, the memory arrays 21 to 24 may be sequentially operated. Consequently, the power consumption is further decreased. In this case, it is necessary to provide as the address counter 103A an address counter capable of outputting the signals $Q_0$ to $Q_{11}$. The signals $Q_{10}$ and $Q_{11}$ out of the signals are used for selecting a memory array block to be driven.

Figure 3:
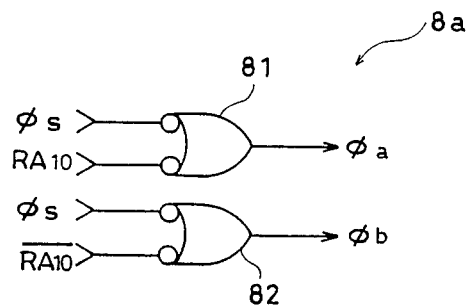
FIG. 3 is a circuit diagram showing one example of a partial act circuit shown in FIG. 1.

FIG. 3 is a circuit diagram showing one example of the partial activation control circuit 8a shown in FIG. 1. In addition, the relation between the input and output signals of this circuit is shown in the following Table 1.

TABLE 1

| $\phi_s$ | $RA_{10}$ | $\phi_a$ | $\phi_b$ |
|---|---|---|---|
| L | 0 | H | H |
|   | 1 | H | H |
| H | 0 | H | L |
|   | 1 | L | H |

Referring to FIG. 3, this partial activation control circuit 8a comprises a NAND gate 81 connected to receive a self-refresh control signal $\phi_s$ and a row address signal $RA_{10}$ and a NAND gate 82 connected to receive the signal $\phi_s$ and a signal $\overline{RA_{10}}$. Driving signals $\phi_a$ and $\phi_b$ are outputted from the NAND gates 81 and 82, respectively. The signal $\phi_s$ is outputted from the refresh control circuit 50a at the time of the self-refresh operation. The signals $RA_{10}$ and $\overline{RA_{10}}$ correspond to the output signal $Q_{10}$ from the address counter 103a, which are applied to this circuit 8a through the row address buffer 104.

In operation, as shown in the table 1, in operations other than the self-refresh operation (when the signal $\phi_s$ is at a low level), the high level activating signals $\phi_a$ and $\phi_b$ are outputted irrespective of the value of the signal $RA_{10}$. On the other hand, in the self-refresh operation, only one of the signals $\phi_a$ or $\phi_b$ attains a high level in response to the signal $RA_{10}$. Thus, only either the circuit 71 and 61 or the circuits 72 and 62 shown in FIG. 1 are activated.

Figure 4:
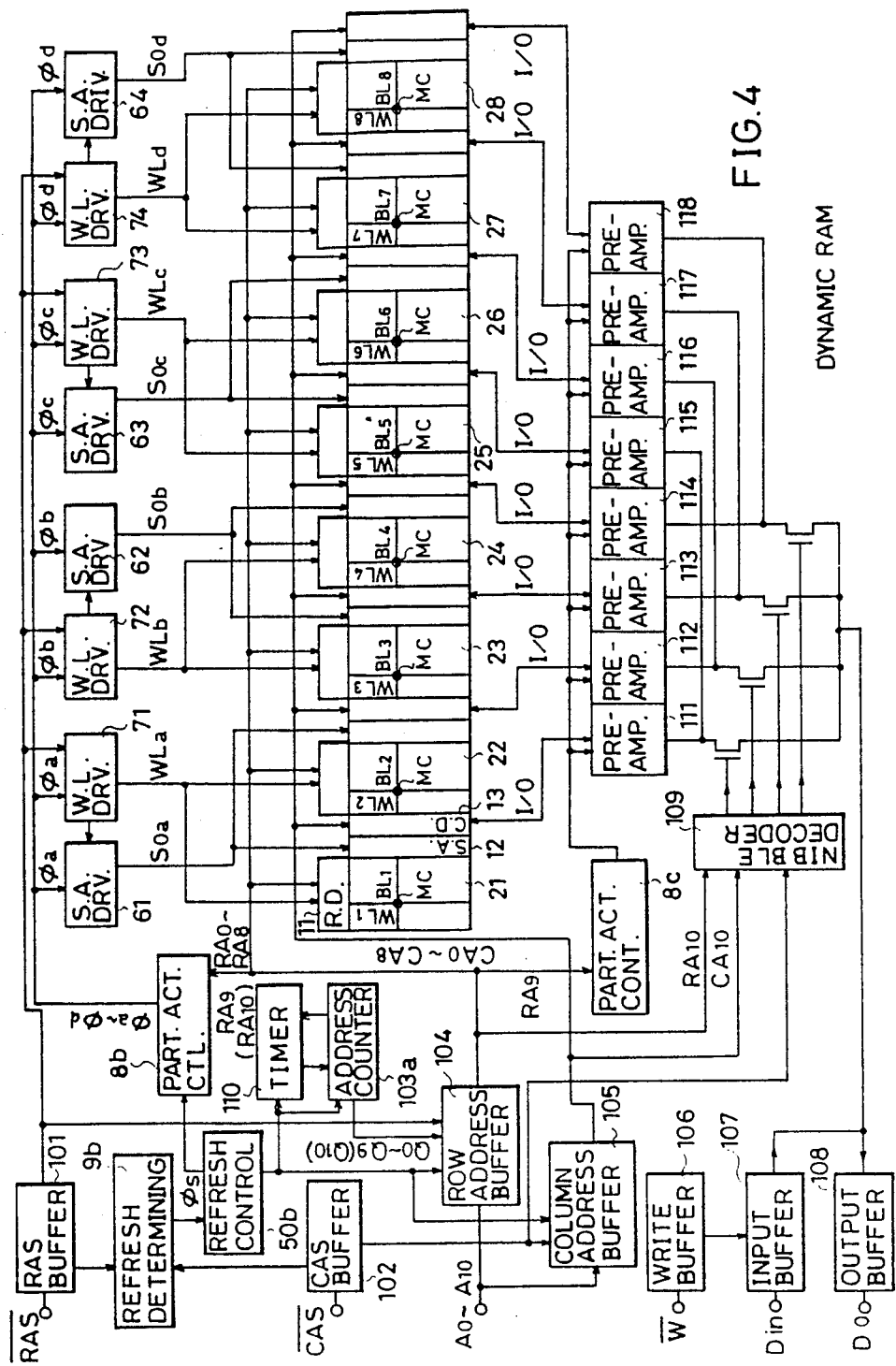
FIG. 4 is a block diagram showing a 4-megabit DRAM according to another embodiment of the present invention.

FIG. 4 is a block diagram showing a 4-megabit DRAM according to another embodiment of the present invention. This DRAM is the same as that shown in FIG. 1, which has a self-refresh mode in addition to an ordinary refresh mode such as a $\overline{CAS}$ before $\overline{RAS}$ refresh mode. The following is a difference from the DRAM shown in FIG. 1. More specifically, in this DRAM, a memory array can be partitioned (into groups in which operations are respectively performed in this example, a memory array is partitioned into two groups) in modes other than the self-refresh mode while the number of partitions can be increased (in this example, the number of partitions can be increased from 2 to 4) in the self-refresh mode. In such a structure, the power consumption in each of the reading, writing and ordinary refresh operations can be decreased, as compared with the DRAM shown in FIG. 1. In addition, the power consumption in the self-refresh mode can be decreased as described below.

Referring to FIG. 4, this DRAM comprises eight memory arrays 21 to 28 each having 512K-bit storage capacity, and eight pre-amplifiers 111 to 118 provided corresponding to the memory arrays. As the number of partitions is increased, the number of word line driving circuits 71 to 74 and the number of sense amplifier driving circuits 61 to 64 are increased, so that a partial activation control circuit 8b for activating the circuits is improved. Furthermore, there is newly provided a partial activation control circuit 8c for controlling pre-amplifiers the number of which is increased.

The improved partial activation control circuit 8b is connected to receive row address signals $RA_9$ and $RA_{10}$. The circuit 8b is responsive to the signal $RA_9$ for partitioning the eight memory array blocks into two groups in which memory operations are respectively performed in reading, writing and ordinary refresh modes while being responsive to the signals $RA_9$ and $R_{10}$ for further partitioning the two groups into four portions in which operations are respectively performed at different timings in the self-refresh mode.

Operations will be described. In the reading operation, address signals $A_0$ to $A_{10}$ are inputted from the exterior in response to timings of the falling edges of $\overline{RAS}$ and $\overline{CAS}$ signals, and the row address signals $RA_0$ to $RA_{10}$ and the column address signals $CA_0$ to $CA_{10}$ are held in the row address buffer 104 and the column address buffer 105, respectively. The partial activation control circuit 8b is responsive to the signal $RA_9$ for outputting activating signals $\phi_a$ to $\phi_b$. For example, when the signal $RA_9$ is "0", the signal $\phi_a$ for activating the circuits 71 and 61 and the signal $\phi_b$ for activating the circuits 72 and 62 are outputted. Thus, in only each of the memory arrays 21 to 24, one of 512 word lines is activated, so that a data signal in a designated memory cell is amplified by a corresponding sense amplifier and read out. The partial activation control circuit 8c operates only the pre-amplifiers 111 to 114, so that the data signal is further amplified and outputted. On the other hand, when the signal $RA_9$ is "1", the same operation is performed with respect to the memory arrays 25 to 28.

In this example, the number of word lines which exist in one memory array is 512, which is one-half that in the DRAM shown in FIG. 1. Thus, the length of a bit line is one-half. The power consumption in the memory array mostly depends on a charging and discharging current of bit line capacitance. Thus, if the length of the bit line becomes one-half, the power consumption is naturally decreased to one-half.

Description is now made on the $\overline{CAS}$ before $\overline{RAS}$ refresh operation. First, designation of this mode is determined by refresh determining circuit 9b. A refresh control circuit 50b is responsive to this determination for outputting to the row address buffer 104 output signals $Q_0$ to $Q_9$ from an address counter 103a. Subsequently, a partial activation is performed in response to the signal $RA_9$, similarly to the above described reading operation. However, the partial activation is in the refresh mode, the data signal is not outputted.

For example, when the signal $RA_9$ is "0", the circuits 71, 72, 61 and 62 are activated in response to signals $\phi_a$ and $\phi_b$. Thus, in each of the memory arrays 21 to 24, the 512 word lines is sequentially activated, so that data signals in 1024 memory cells are refreshed. The signal $RA_9$ repeats a cycle of "0" 512 times and repeats a cycle of "1" 512 times every 16µs on average. More specifically, the signal $RA_9$ repeats a $\overline{CAS}$ before $\overline{RAS}$ refresh cycle a total of 1024 times during 16ms (=16µs×1024), so that all the memory cells are refreshed. Thus, even in the $\overline{CAS}$ before $\overline{RAS}$ refresh operation, the power consumption is decreased for the same reason as that in the reading operation.

Description is now made on an operation of the self-refresh mode.

This mode is determined by the refresh determining circuit 9b. The refresh control circuit 50b is responsive to this determination for outputting a self-refresh detecting signal $\phi_s$ to the partition operation control circuit 8b, to operate a timer 110. The address counter 103a is operated in response to a signal from the timer 110, to output to the row address buffer 104 the output signals $Q_0$ to $Q_{10}$ which are more, by one bit, than the output signals in a case of the above described $\overline{CAS}$ before $\overline{RAS}$ refresh mode. The row address buffer 104 outputs the row address signals $RA_0$ to $RA_{10}$.

The partial activation control circuit 8b is responsive to the signals $RA_9$ and $RA_{10}$ for controlling the following partial activation. More specifically, the memory arrays 21 to 28 are partitioned into four groups in which operations are respectively performed.

Figure 13A:
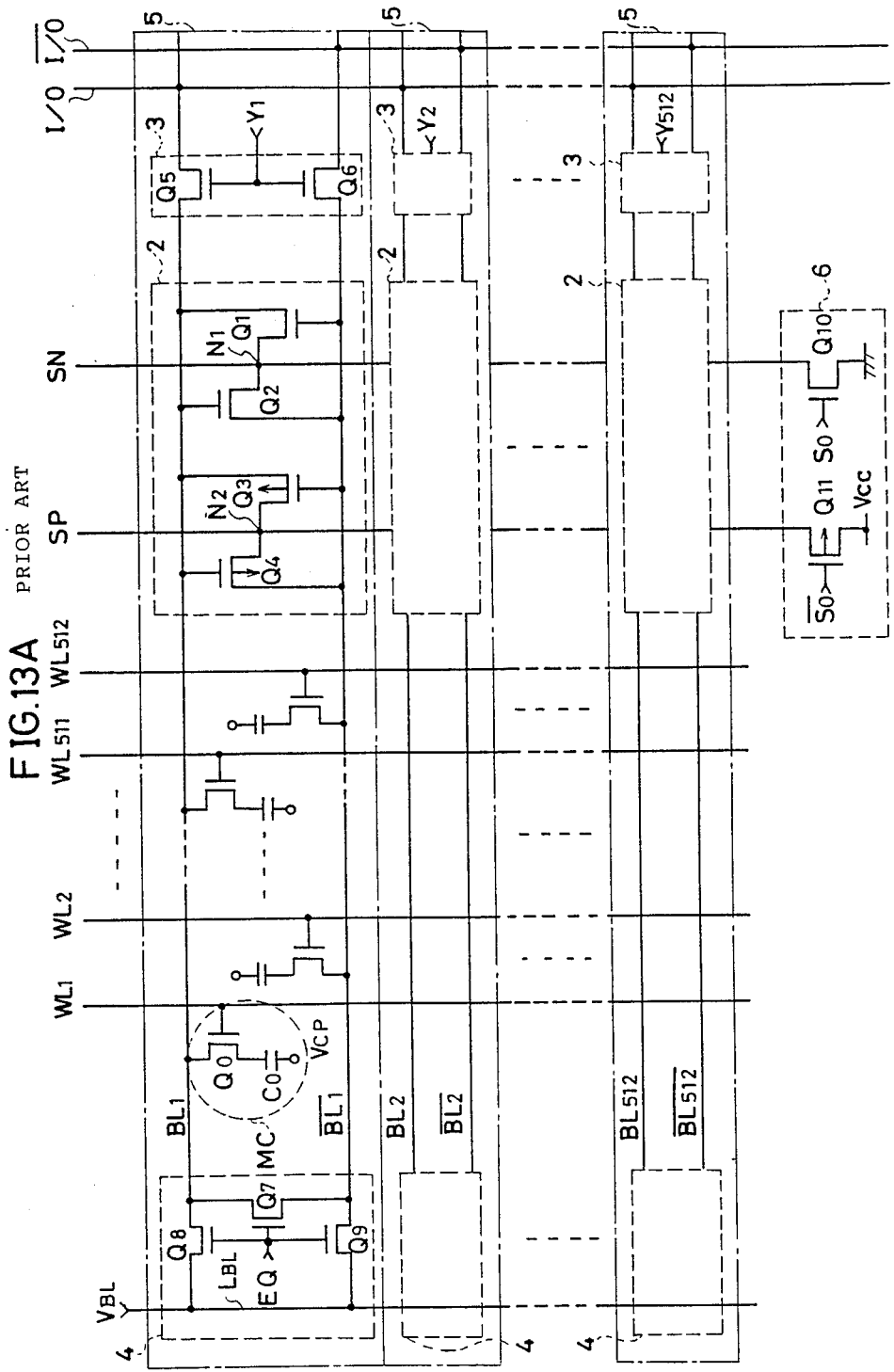
FIG. 13A is a circuit diagram showing a memory array block shown in FIG. 12.
Figure 13B:
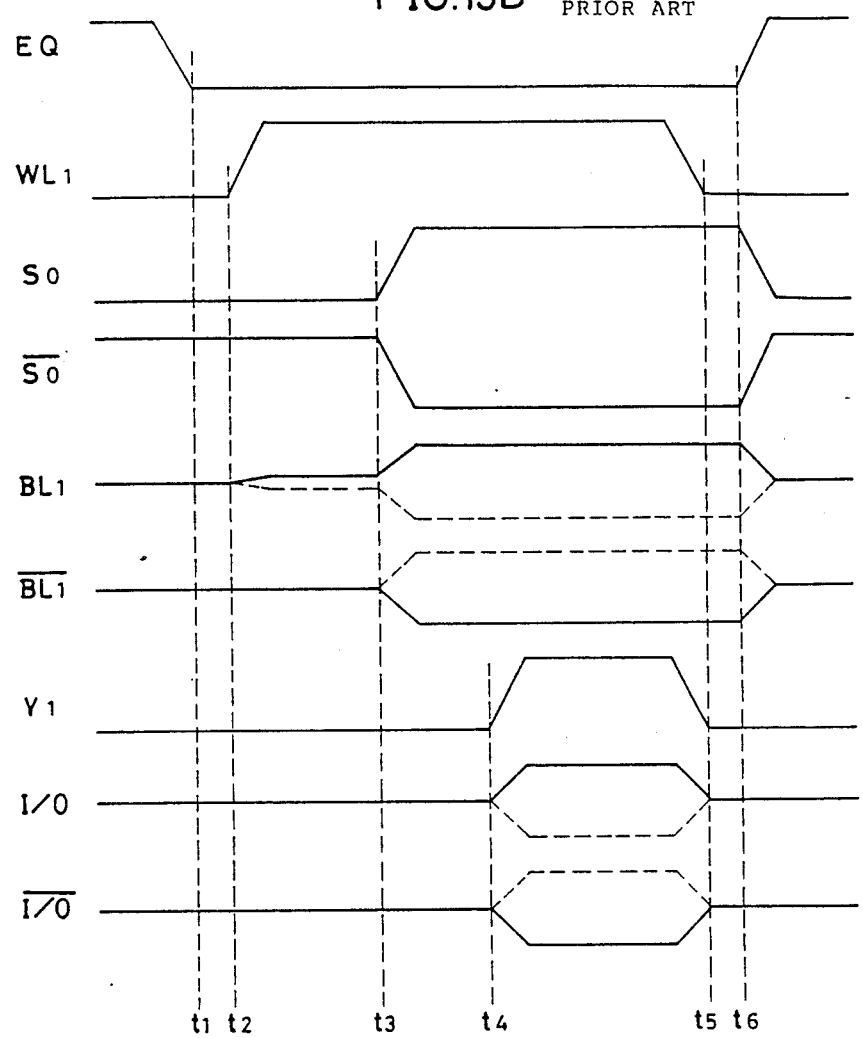
FIG. 13B is a timing chart for explaining an operation of the circuit shown in FIG. 13A.

For example, when the signals $RA_9$ and $RA_{10}$ are "0" and "0", respectively, the circuits 71 and 61 are activated in response to the activating signal $\phi_a$. Consequently, one of the 512 word lines is sequentially activated in each of the memory arrays 21 and 22, so that data signals in the 1024 memory cells are refreshed. On the other hand, in the memory arrays 23 to 28, the circuits 72 to 74 and 62 to 64 are not activated, so that the memory arrays 23 to 28 remain in a standby state. Meanwhile, in a circuit corresponding to that shown in FIG. 13A, a high level equalize signal EQ, which is omitted in FIG. 4, controlled by the partial activation control circuit 8b is applied to the memory arrays 23 to 28.

Since the address counter 103a outputs the signals $Q_0$ to $Q_{10}$ in response to a signal outputted from the timer 110 every 16µs, data signals of a total of 1-megabit in the memory arrays 21 and 22 are refreshed. During the subsequent 8ms, signals in the memory arrays 25 and 26 are refreshed. In addition, during the next 16ms, signals in the memory arrays 23, 24, 27 and 28 are refreshed. More specifically, during 32ms, the signals in the 4-megabit memory cells are all refreshed.

As described in the foregoing, in the self-refresh operation, the number of memory arrays which are operated per unit time becomes one-half, so that the power consumed as the memory arrays are operated is also decreased to one-half, as compared with those in the reading, writing and ordinary refresh operations.

Figure 5A:
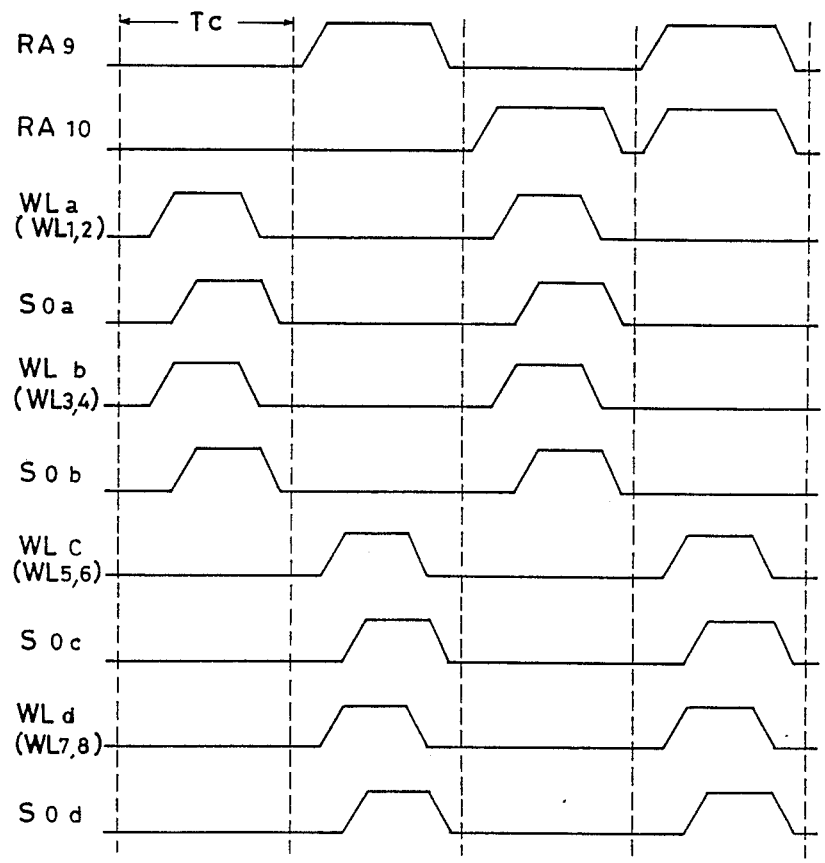
FIGS. 5A and 5B are timing charts for explaining operations in an ordinary.. refresh mode and a self-refresh mode of the DRAM shown in FIG. 4, respectively.
Figure 5B:
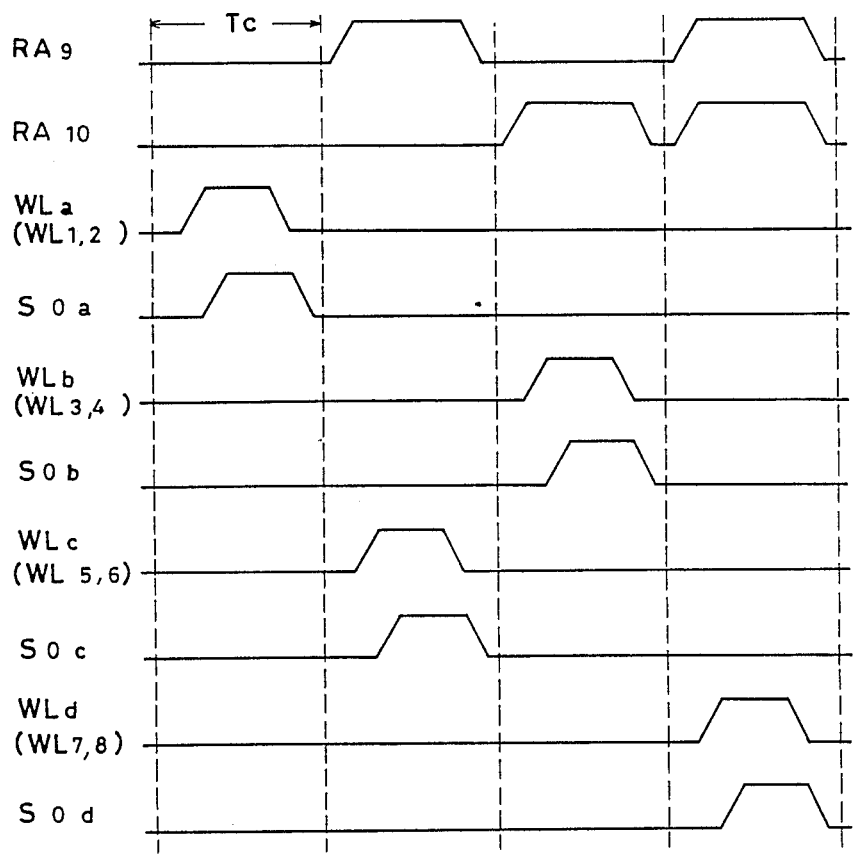

FIGS. 5A and 5B are timing charts for explaining operations in the ordinary refresh mode and the self-refresh mode of the DRAM shown in FIG. 4, respectively. In the ordinary refresh mode, in response to the signal $RA_9$, word line driving signals WLa and WLb and sense amplifier driving signals Soa and Sob are outputted in the same period Tc, and signals WLc and WLd and signals Soc and Sod are outputted in the other period. Thus, it will be found that circuits associated with the four memory arrays 21 to 24 are simultaneously operated in a given period Tc and circuits associated with the remaining memory arrays 25 to 28 are operated in the next period.

Referring to FIG. 5B, in the self-refresh mode, the signals WLa and SOA and WLc and Soc, WLb and Sob and WLd and Sod are sequentially outputted in response to the signals $RA_9$ and $RA_{10}$, so that the memory arrays 21 to 28 are partitioned into four groups in which memory operations are respectively operated. Thus, it will be found that only circuits associated with the two memory arrays in each period.

Figure 6:
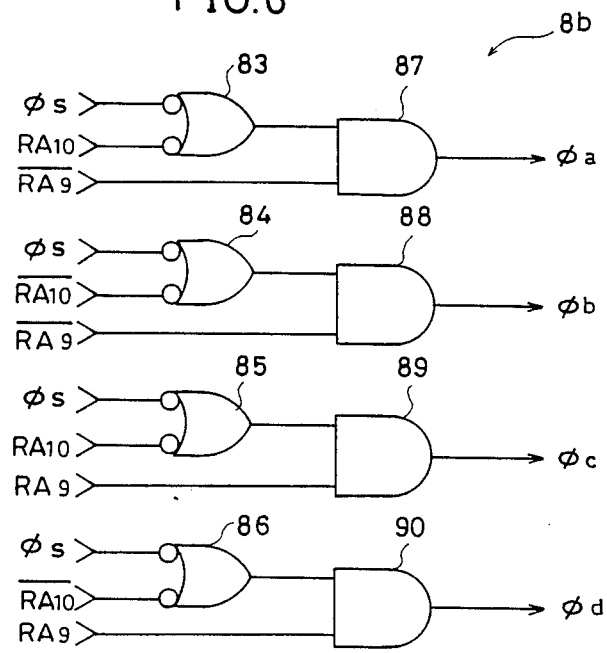
FIG. 6 is a circuit diagram showing one example of the partial activation control circuit shown in FIG. 4.

FIG. 6 is a circuit diagram showing one example of the partial activation control circuit 8b shown in FIG. 4. In addition, the relation between input/output signals of this circuit is shown in the following table 2.

TABLE 2

| $\phi_s$ | $RA_{10}$ | $RA_9$ | $\phi_a$ | $\phi_b$ | $\phi_c$ | $\phi_d$ |
|---|---|---|---|---|---|---|
| L | 0 | 0 | H | H | L | L |
|   |   | 1 | L | L | H | H |
|   | 1 | 0 | H | H | L | L |
|   |   | 1 | L | L | H | H |
| H | 0 | 0 | H | L | L | L |
|   |   | 1 | L | L | H | L |
|   | 1 | 0 | L | H | L | L |
|   |   | 1 | L | L | L | H |

Referring to FIG. 6, this partial activation control circuit 8b comprises NAND gates 83 to 86 connected to receive a self-refresh mode detecting signal $\phi_s$ and a row address signal $RA_{10}$ or $\overline{RA_{10}}$, AND gates 87 to 90 connected to receive output signals of the NAND gates 83 to 86 and a signal $RA_9$ or $\overline{RA_9}$. Activating signals $\phi_a$ to $\phi_b$ are respectively outputted from the NAND gates 87 to 90.

In operation, as shown in the table 2, in operations other than an operation in the self-refresh mode (when the signal $\phi_s$ is at low level), the signals $\phi_a$ and $\phi_b$ and the signals $\phi_c$ and $\phi_d$ are outputted in response to the signal $RA_9$. On the other hand, in the operation in the self-refresh mode (when the signal $\phi_s$ is at a high level), the signals $\phi_a$ to $\phi_b$ are outputted in response to the signals $RA_9$ and $RA_{10}$.

Figure 7A:
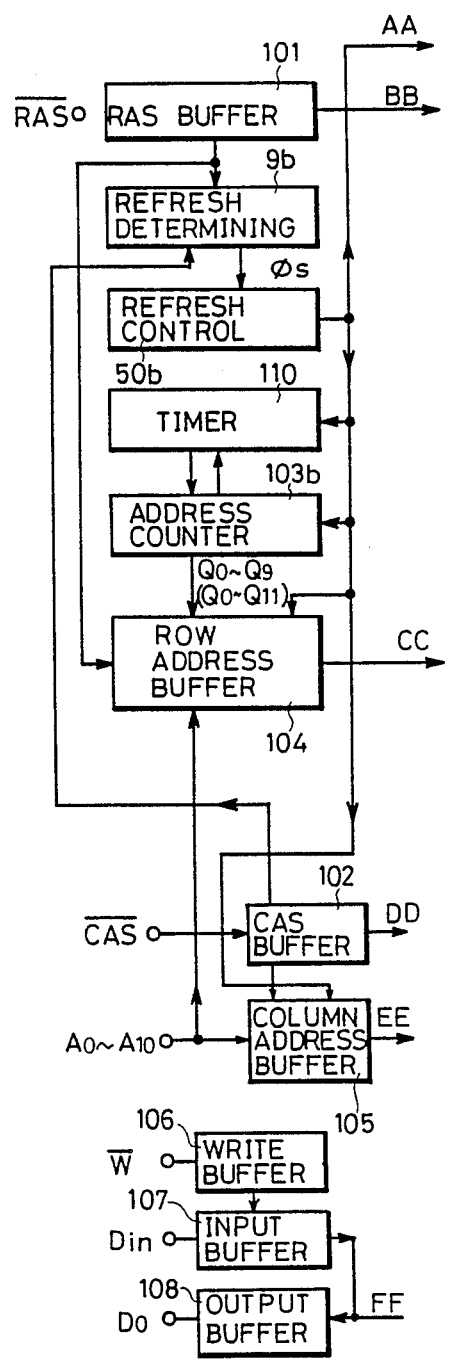
FIGS. 7A to 7C are block diagram showing the 4-megabit DRAM according to another embodiment of the present invention.
Figure 7:
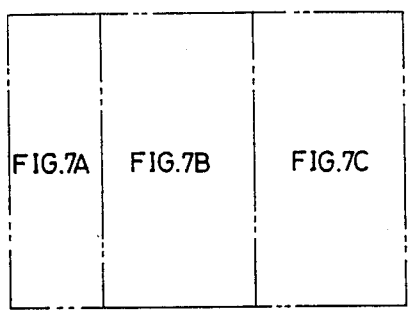
FIG. 7 is a diagram showing connection between FIGS. 7A to 7C.
Figure 7D:
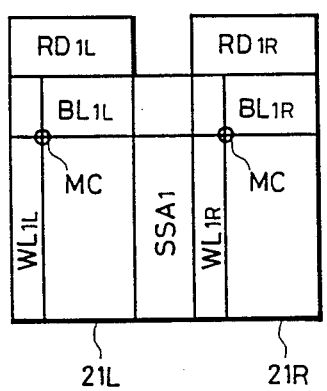
FIG. 7D is a block diagram showing a memory array block shown in FIG. 7B.
Figure 7B:
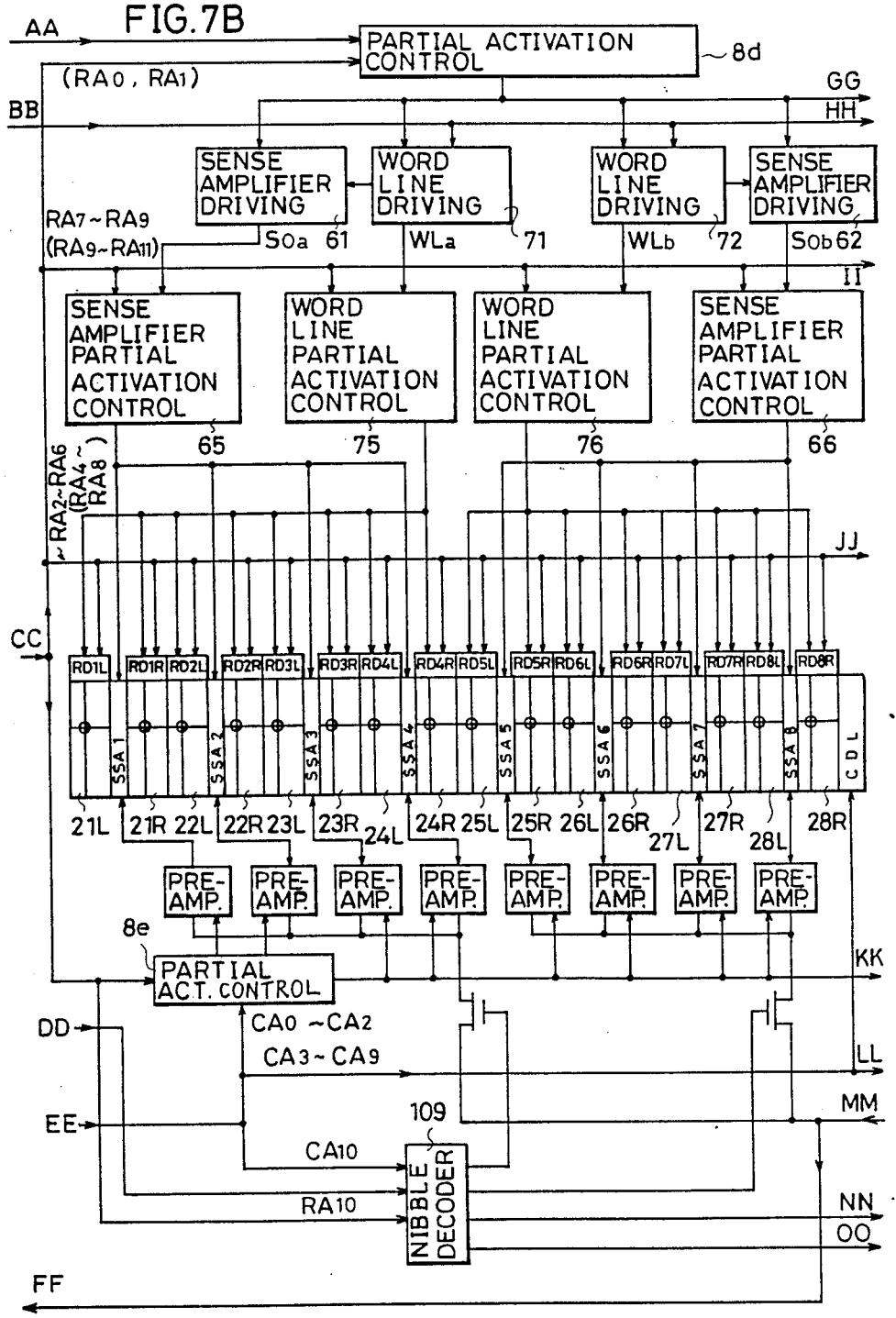
Figure 7C:
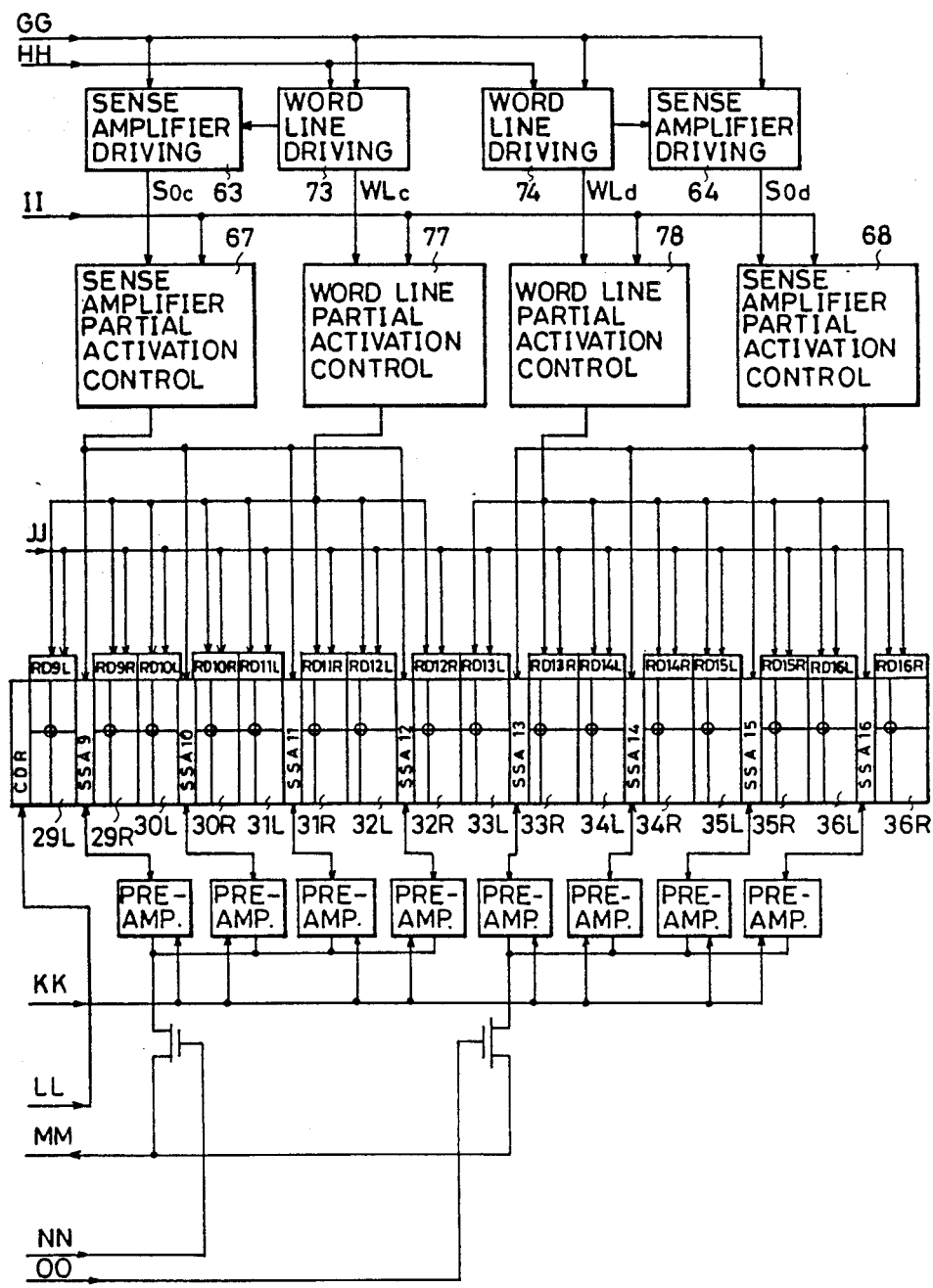

FIGS. 7A to 7C are block diagrams showing a DRAM according to another embodiment of the present invention. FIG. 7 is a diagram showing connection between FIGS. 7A to 7C. This DRAM is characterized in that all memory arrays are partitioned into eight groups in which memory operations are respectively performed in a mode other than a self-refresh mode while being partitioned into 32 groups in which memory operations are respectively performed in the self-refresh mode.

Referring to FIGS. 7A to 7C, the following is a principal difference from the DRAM shown in FIG. 4. First, each of the memory arrays is partitioned into two memory arrays on a left side (L) and a right side (R). One sense amplifier is provided for each of the partitioned memory arrays on both sides. More specifically, a shared sense amplifier (SSA) system is applied to this DRAM. The figures show shared sense amplifiers SSA1 to SSA16. In addition, column decoders CDL and CDR are provided for each 2-megabit memory array, so that the area of a chip is prevented from being increased. Furthermore, since the number of partitions is increased, word line partial activation control circuits 75 to 78 are newly provided between each of word line driving circuits 71 to 74 and a memory array block. Similarly, sense amplifier partial activation control circuits 65 to 68 are newly provided between sense amplifier driving circuits 61 to 64 and the memory array blocks, respectively. FIG. 7D is a block diagram showing, as one example, partitioned memory arrays 21L and 21R as well as row decoders RD1L and RD1R and a shared sense amplifier SSA1.

In operation, in a mode other than the self-refresh mode, all memory arrays are partitioned into four groups in response to row address signals $RA_7$ to $RA_9$, each of the groups being partitioned into eight portions in which memory operations are respectively performed. On the other hand, in the self-refresh mode, only one group out of the above described four groups is activated in response to row address signals $RA_0$ to $RA_1$. As a result, each portion in one group corresponds to 1/32 of all the memory arrays, in which a refresh operation is performed.

Figure 8:
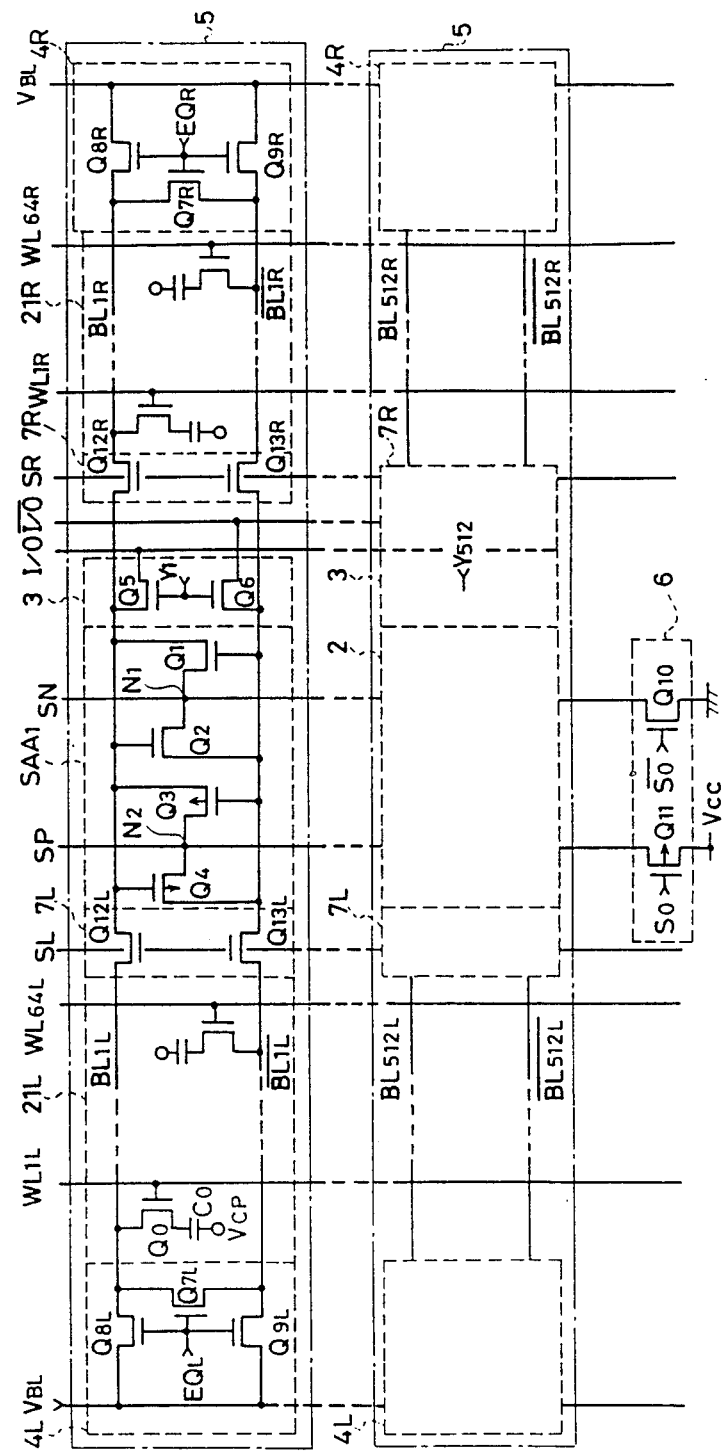
FIG. 8 is a circuit diagram showing the memory array block shown in FIG. 7B.

FIG. 8 is a circuit diagram showing an example of a specific circuit of each of the memory array blocks shown in FIG. 7B. Referring to FIG. 8, the following is a principal difference from the circuit shown in FIG. 13A. A shared sense amplifier SSA1 is provided between the partitioned memory arrays 21L and 21R, switching circuits 7L and 7R being respectively connected between the sense amplifiers SSA1 and the memory arrays 21L and 21R. The switching circuits 7L and 7R respectively comprise NMOS transistors $Q_{12L}$ and $Q_{13L}$ and NMOS transistors $Q_{12R}$ and $Q_{13R}$, which are respectively operated in response to signals SL and SR.

In operation, one of the signals SL and SR is changed to a high level in response to a row address signal $RA_7$. The switching circuit 7L or 7R is turned on in response to this signal, so that the sense amplifier SSA1 and a read/write line pair I/0 and $\overline{I/0}$ are connected to a bit line pair on a left or right side. The side of the bit line which is not connected to the sense amplifier SSA1 and the read/write line pair I/0 and $\overline{I/0}$ is brought to a standby state. In this state, the whole is partitioned into two groups in which operations are respectively performed. Sense amplifier driving signals So and $\overline{So}$ are generated in response to row address signals $RA_8$ and $RA_9$, so that a sense amplifier is partitioned into four groups in which operations are respectively performed.

FIG. 9A is a block diagram showing a 4-megabit DRAM according to still another embodiment of the present invention. Referring to FIG. 9A, the 4-megabit DRAM differs from the DRAM shown in FIG. 1 in that there is provided an improved partial activation control circuit 8d connected to receive row address signals $RA_0$ to $RA_{10}$. Signals $RA_{0a}$ to $RA_{9a}$ and $RA_{0b}$ and $RA_{9b}$ are outputted to memory array blocks from the circuit 8d.

FIG. 9B is a circuit diagram showing one example of the partial activation control circuit 8d shown in FIG. 9A. Referring to FIG. 9B, this partial activation control circuit 8d is provided with circuits 81a and 82b for partitioning a row decoder into groups in which operations are respectively performed, in addition to the circuits shown in FIG. 3. For example, the circuit 81a comprises 20 AND gates. Each of the AND gates has one input connected to an activating signal $\phi_a$ which is an output signal of a NAND gate 81. Each of the AND gates has another input connected to receive the row address signals $RA_0$ to $RA_9$ and inverted signals thereof. The circuit 82b has the same circuit structure.

In operation, in a self-refresh mode, when the signal $RA_{10}$ is "0", row decoders respectively connected to memory arrays 21 and 22 are selectively operated in response to the signals $RA_{0a}$ to $RA_{9a}$. In addition, when the signal $RA_{10}$ is "1", row decoders 11 respectively connected to memory arrays 23 and 24 are selectively operated in response to the signals $RA_{0b}$ to $RA_{9b}$. On the other hand, in a mode other than the self-refresh mode, the four row decoders 11 are simultaneously operated irrespective of the value of the signal $RA_{10}$.

As described in the foregoing, in the self-refresh mode, the four row decoders 11 respectively connected to the memory arrays 21 to 24 can be also partitioned into groups in which operations are respectively performed, so that the power consumption can be further decreased.

Figure 10A:
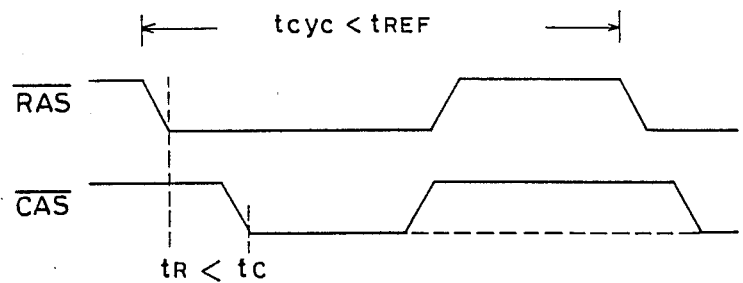
FIGS. 10A to 10C are timing charts for explaining an operation of a refresh determining circuit shown in FIG. 1.
Figure 10B:
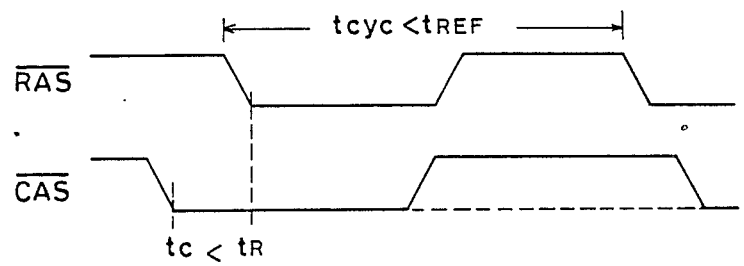
Figure 10C:
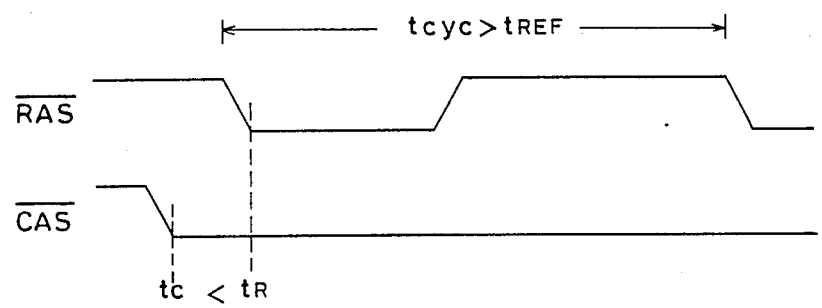

FIGS. 10A to 10C are timing charts for explaining an operation of the refresh determining circuit 9b shown in FIG. 1. Each figure shows changes in $\overline{RAS}$ and $\overline{CAS}$ signals. Times $t_R$ and $t_C$ indicate timings of the falling edges of the $\overline{RAS}$ and $\overline{CAS}$ signals, respectively.

FIG. 10A shows a case in which an ordinary read or write mode is detected. The $\overline{RAS}$ signal falls at the time $t_R$ and then, the CAS signal falls at the time $t_C$. The refresh determining circuit 9b determines timings at which the signals are changed, to determine designation of the read or write mode.

Additionally, FIG. 10B shows a case in which a $\overline{CAS}$ before $\overline{RAS}$ refresh mode is detected. In this case, the e,ovs/CAS/ signal falls at the time $t_C$ and then, the $\overline{RAS}$ signal falls at the time $t_R$. The determining circuit 9b determines timings at which the signals are changed, to recognize that the $\overline{CAS}$ before $\overline{RAS}$ refresh mode is designated. Meanwhile, in determination of the modes shown in FIGS. 10A to 10B, a time $t_{cyc}$ required for one memory cycle is the maximum refresh time $t_{REF}$ as defined or less.

FIG. 10C shows a case in which a self-refresh mode is detected. In this case, the $\overline{CAS}$ signal falls and then, the $\overline{RAS}$ signal falls, similarly to the case of the $\overline{CAS}$ before $\overline{RAS}$ refresh mode. In addition, the determining circuit 9b determines that the memory cycle time $t_{cyc}$ exceeds the defined refresh time $t_{REF}$. Thus, the self-refresh mode is recognized.

Figure 11A:
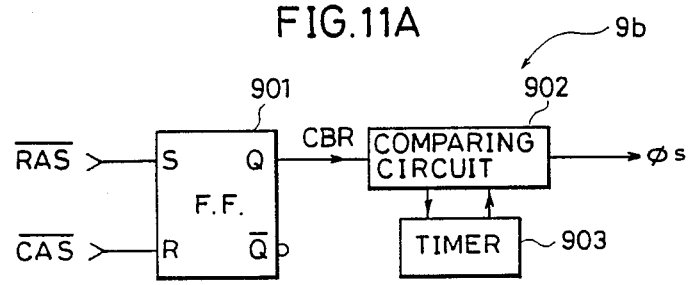
FIG. 11A is a block diagram showing one example of the refresh determining circuit shown in FIG. 1.
Figure 11B:
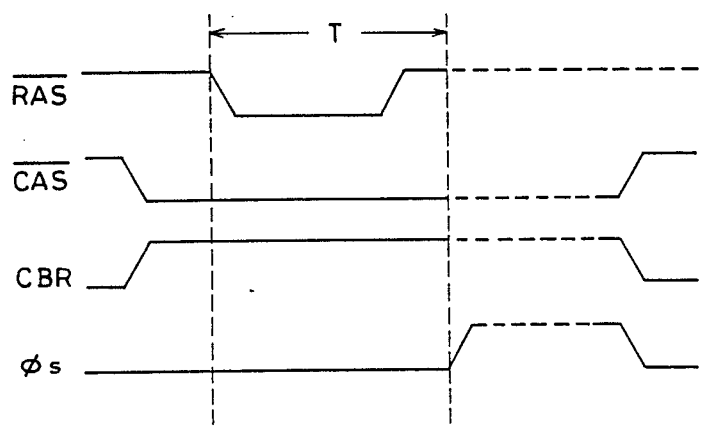
FIG. 11B is a timing chart for explaining an operation of the circuit shown in FIG. 11A.

FIG. 11A is a block diagram showing one example of the refresh determining circuit 9b shown in FIG. 1, and 11B a timing chart for explaining the operation. Referring to FIG. 11A, the determining circuit 9b comprises an SR flip-flop 901 having its set input and reset input respectively receiving $\overline{RAS}$ and $\overline{CAS}$ signals, a comparing circuit 902 connected to one output of the SR flip-flop 901, and a timer 903 connected to the comparing circuit 902.

In an operation of detecting a self-refresh mode, the flip-flop 901 is set in response to a high level $\overline{RAS}$ signal, so that a high level output signal CBR is outputted. The timer 903 is operated in response to the signal CBR. The comparing circuit 902 outputs a high level activating signal $\phi_s$ when the signal CBR is at a high level beyond a predetermined time T ($> t_{REF}$) Thereafter, when the $\overline{CAS}$ signal is changed to a high level, the flip-flop 901 is reset, so that the signals CBR and $\phi_s$ are changed to a low level. Consequently, the self-refresh mode is determined by the determining circuit 9b.

Description was made by means of four embodiments, in which case the number of partitions in the self-refresh mode is shown as one example. More specifically, the present invention is not limited to the same. For example, in the self-refresh mode, the memory arrays are partitioned into the number exceeding the number of partitions in the ordinary refresh mode, to refresh data signals in the memory arrays, so that the power consumption can be decreased.

Although in the above described embodiments description was made on a case in which the set time of the timer 110 is 16μs, i.e., the address counters 103a and 103b are incremented every 16μs, this set time may be, for example, 32μs. Consequently, the power consumption is further decreased. In addition, if the set time of the timer is set long in a range which does not exceed the capability of the refresh time of the memory cell, the power consumption can be responsively decreased. In this case, means for increasing the capability of the refresh time of the memory cell only at the time of the self-refresh mode may be simultaneously used. For example, the level of the bit line precharging potential $V_{PL}$ shown in FIG. 13A may be controlled, in which case the effect is enhanced.

Figure 11C:
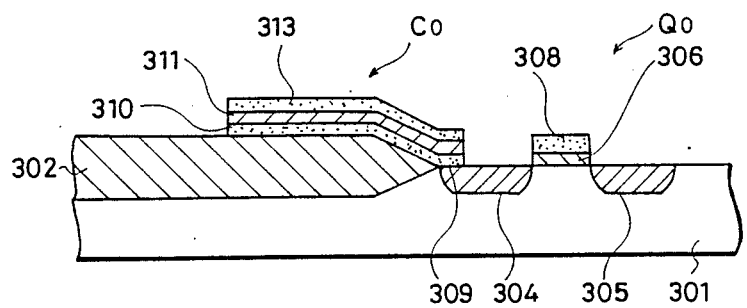
FIG. 11C is a cross-sectional view showing a structure of a stacked capacitor type memory cell according to one embodiment of the present invention.

FIG. 11C is a cross-sectional view showing a structure of a stacked capacitor type memory cell employed in the DRAM shown in FIG. 1. Referring to FIG. 11C, the memory cell differs from the conventional planar type memory cell shown in FIG. 13C in that a capacitor $C_0$ is stacked.

More specifically, the capacitor $C_0$ is formed on an insulating film 302 for isolating memory cells. The capacitor $C_0$ comprises a storage node 310 and a cell plate 313 opposed to each other through an insulating film 311. The storage node 310 and the cell plate 313 constitute two electrodes of the capacitor $C_0$. A large part of the lower side of the storage node is formed on the insulating film 302, and an end of the lower side thereof is coupled to an N+impurity region 304 in a contact region 309.

Figure 13C:
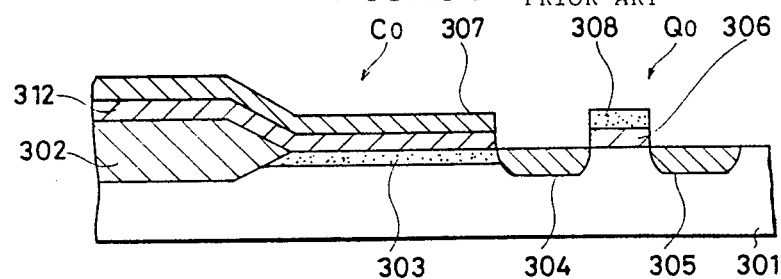
FIG. 13C is a cross-sectional view showing a structure of a planar capacitor type memory cell employed in the conventional DRAM.

A junction leak current does not easily flow through the capacitor $C_0$ shown in FIG. 11C, as compared with the capacitor shown in FIG. 13C. More specifically, as obvious from FIG. 11C, since a large part of the lower side of the storage node 310, which constitutes one electrode of the capacitor $C_0$, is joined to the insulating film 302, a junction leak current does not easily flow into a substrate 301. As a result, due to the decrease in junction leak current, signal charges stored in the capacitor $C_0$ are not easily lost. Thus, a refresh cycle for refreshing a data signal stored in the memory cell can be set longer.

Figure 11D:
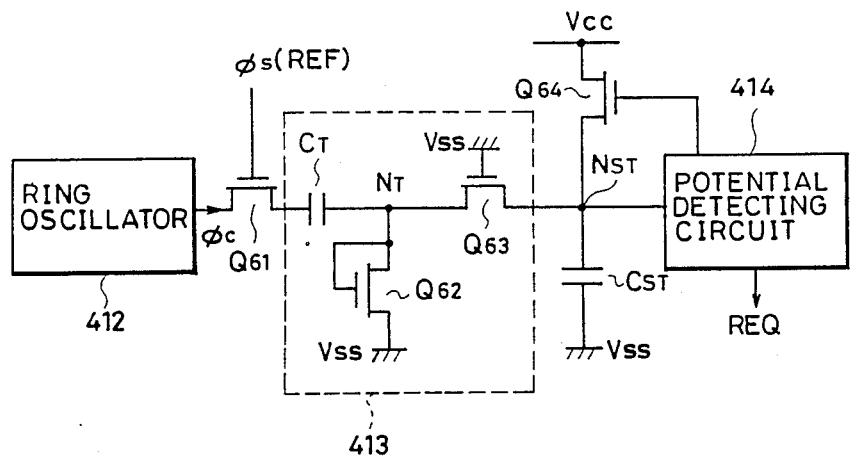
FIG. 11D is a circuit diagram showing an example of a timer employed in the DRAM shown in FIG. 1.

FIG. 11D is a circuit diagram showing an example of the timer 110 employed in the DRAM shown in FIG. 1. Referring to FIG. 11D, this timer circuit comprises a ring oscillator 420 shared with a substrate bias voltage generating circuit, a charge pump circuit 413 connected to the ring oscillator 420 through an NMOS transistor Q61, and a potential detecting circuit 414 connected to an output node $N_{ST}$ of the circuit 413. An NMOS transistor Q64 is connected between a power supply Vcc and the node $N_{ST}$. The transistor Q64 has its gate connected to receive a control signal from the potential detecting circuit 414. A capacitor $C_{ST}$ is connected between the node $N_{ST}$ and ground Vss. The transistor Q61 has its gate connected to receive a self-refresh control signal $\phi_s$ outputted from the refresh control circuit 50a shown in FIG. 1 or an ordinary refresh request signal.

The charge pump circuit 413 comprises two NMOS transistors Q62 and Q63 and a capacitor $C_T$. The capacitor $C_T$ and the transistor Q63 are connected to each other at a node $N_T$. The transistor Q62 is connected between the node $N_T$ and the ground Vss. The transistor Q62 has its gate connected to the node $N_T$. The transistor Q63 has its gate connected to the ground Vss.

Figure 11E:
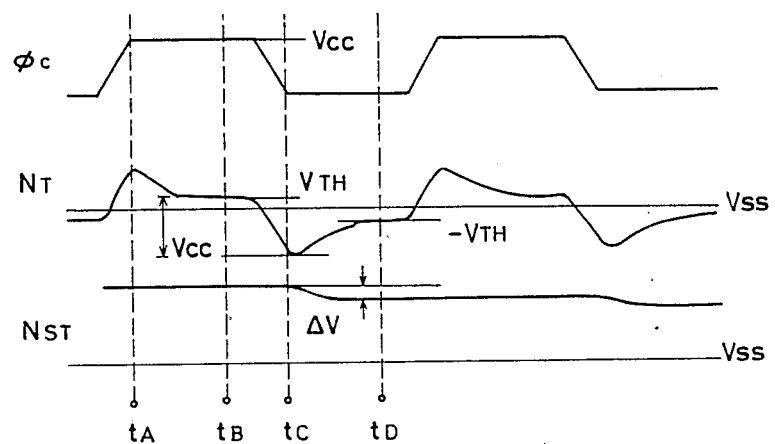
FIG. 11E is a timing chart for explaining an operation of the timer circuit shown in FIG. 11D.

FIG. 11E is a timing chart for explaining an operation of the timer circuit shown in FIG. 11D. Referring now to Figs. 11D and 11E, the operation will be described.

It is assumed that the node $N_{ST}$ has been charged in advance at a power supply Vcc level. When the refresh control signal $\phi_s$ is changed from a low level to a high level, the transistor Q61 is turned on. When an output signal $\phi_c$ of the ring oscillator 412 is changed from a low level to a high level at a time $t_A$, the node $N_T$ is raised to a high level due to capacitive coupling of the capacitor $C_T$. Consequently, the transistor Q62 is turned on (the transistor Q63 remains off), so that a voltage level of the node $N_T$ starts to be lowered. When the level of the node $N_T$ is equal to a threshold voltage $V_{TH}$ of the transistor Q62, the transistor Q62 is turned off, so that discharging of the node $N_T$ is stopped (at a time $t_B$) Then, when the output signal $\phi_c$ of the ring oscillator 412 is changed from a high level to a low level at a time $t_C$, the node $N_T$ is lowered to a negative potential due to capacitive coupling of the capacitor $C_T$. Consequently, the transistor Q63 is turned on (the transistor Q62 remains off), so that positive charges stored in the capacitor $C_{ST}$ are transferred to the node $N_T$. Consequently, the voltage level of the node $N_T$ attempts to approach 0V. However, when the level of the node $N_T$ is equal to $-V_{TH}$ (at a time $t_D$), the transistor Q63 is turned off, so that the transfer of charges is stopped. The amount $Q_T$ of charges transferred from the capacitor $C_{ST}$ to the capacitor $C_T$ every one cycle of the output signal $\phi_c$ of the ring oscillator 412 is represented by the following equation:

$$Q_T = C_T(V_{CC} - 2V_{TH}) \quad (1)$$

From the equation (1), the amount $\Delta V$ of the change in potential of the node $N_{ST}$ every one cycle of the output signal $\phi_c$ of the ring oscillator 412 is given by the following equation:

$$\begin{aligned}\Delta V &= Q_T/C_{ST} \\ &= (C_T/C_{ST}) \cdot (V_{CC} - 2V_{TH})\end{aligned} \quad (2)$$

An advantage of this timer circuit is that the amount $Q_T$ of charges transferred every one cycle of the output signal $\phi_c$ of he ring oscillator 412 is always constant independently of the voltage level of the node $N_{ST}$. Thus, the voltage level of the node $N_{ST}$ is approximately linearly lowered towards 0V from the power-supply voltage Vcc. When the level becomes $V_{TH}$, a high level refresh request signal REQ is outputted. At the same time, the transistor Q64 is turned on in response to a signal from the potential detecting circuit 414, so that the node $N_{ST}$ is charged at the Vcc level, that is, the timer circuit is reset. An output cycle of the signal REQ or a set time $t_{set}$ of the timer circuit is equal to the time when the node $N_{ST}$ is lowered from the power-supply voltage Vcc to $V_{TH}$, which is represented by the following equation:

$$\begin{aligned}t_{set} &= \frac{1}{f_C} \cdot \frac{V_{CC} - V_{TH}}{\Delta V} \\ &= \frac{1}{f_C} \cdot \frac{C_{ST}}{C_T} \cdot \frac{V_{CC} - V_{TH}}{V_{CC} - 2V_{TH}}\end{aligned} \quad (3)$$

where $f_C$ is a frequency of the output signal $\phi_C$ of the ring oscillator 412.

From the equation (3), it is found that the set time $t_{set}$ of the timer is a function of $f_C$, $C_{ST}/C_T$, Vcc and $V_{TH}$.

Meanwhile, it is considered that a term of $(V_{CC}-V_{TH})/(V_{CC}-2V_{TH})$ in the equation (3) is approximately constant even if the power-supply voltage Vcc is changed. Thus, the following equation is obtained by simplifying the equation (3):

$$t_{set} \approx k \cdot (1/f_C) \quad (4)$$

where k is a proportionality constant.

More specifically, the set time $t_{set}$ of the timer circuit can be set with precision by mainly controlling the frequency $f_c$ of the output signal $\phi_c$ of the ring oscillator 412 and the ratio of the capacitance values of the capacitors $C_{ST}$ and $C_T$.

A timer having a long set time $t_{set}$ shown in FIG. 11D is applied to the DRAM having the memory cell shown in FIG. 11C, so that a refresh interval can be made longer. As the result, the power consumption can be decreased under not only the ordinary refresh mode but also the self-refresh mode of battery backup.

Although in the above described embodiments, the memory cell is structured by the NMOS transistor, a PMOS transistor can be employed.

Furthermore, although in the above described embodiments, description was made on the 4-megaword×1-bit DRAM, the present invention is not limited to the same. For example, a 1-megaword×4-bit DRAM (of a 4-bit parallel input/output type) may be used, to which case the present invention can be applied. In addition, the present invention can be applied irrespective of the presence or absence of a nibble mode function.

Figure 14:
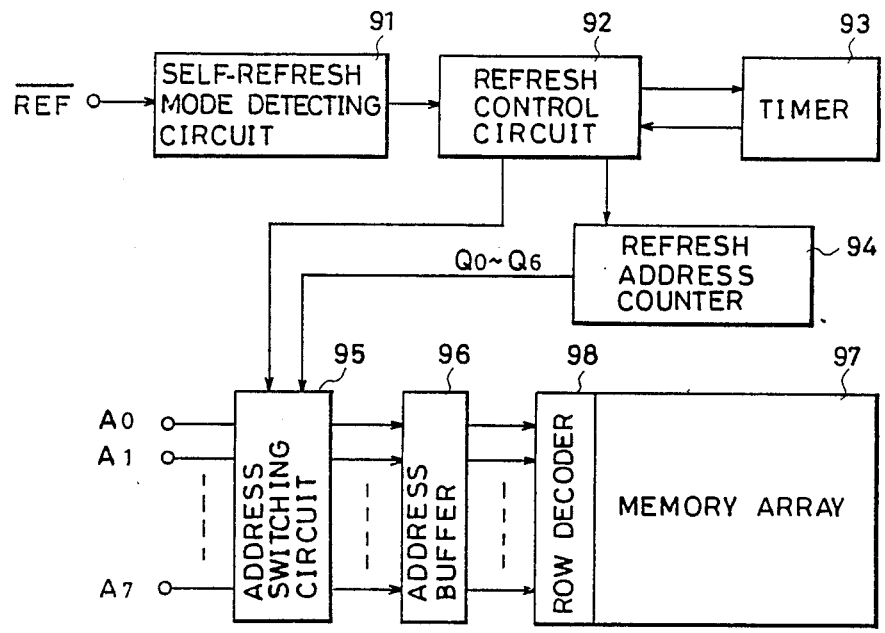
FIG. 14 is a block diagram showing one example of a conventional DRAM having a self-refresh mode.
Figure 15:
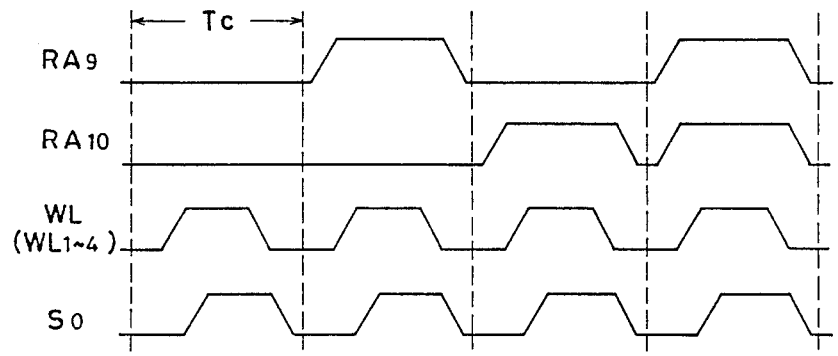
FIG. 15 is a timing chart for explaining an ordinary refresh operation of the DRAM shown in FIG. 12.

Additionally, in order to detect designation of the self-refresh mode, there may be provided a dedicated self-refresh mode detecting circuit shown in FIG. 14, for example.

As described in the foregoing, in the example of the DRAM shown in FIG. 1, since the memory arrays 21 to 24 are alternately refreshed two by two in the self-refresh mode, the number of memory arrays refreshed per unit time becomes one-half, as compared with that in the operation under the ordinary refresh mode. Thus, the power consumption required for self-refreshing is decreased to half. It is the same with the example of the DRAM shown in FIG. 4. In addition, partition control for self-refreshing can be easily performed by increasing the number of bits of the output signal from the address counter 103a. On the other hand, the memory cell having the structure shown in FIG. 11C is used in the DRAM, so that the junction leak current is decreased, whereby the data signals stored in the memory cells are not easily lost. As a result of the foregoing, the cycle of the self-refresh operation can be set long, whereby the power consumption is decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic access memory device having a self-refresh mode in which a periodic refresh operation is automatically initiated, in addition to an ordinary refresh mode in which a predetermined refresh operation is performed in response to an externally applied refresh request signal, comprising:
    a plurality of memory array blocks each comprising a memory cell for storing a data signal,
    refresh address generating means connected to said plurality of memory array blocks for generating a refresh address signal for sequentially selecting memory cells in said memory array blocks to be refreshed,
    refreshing means responsive to said refresh address signal for refreshing data stored in said selected memory cells in said memory array blocks,
    said refreshing means selectively refreshing data stored in first predetermined ones of said plurality of memory array blocks in response to application of said refresh request signal,
    means for receiving an external control signal for operating said memory device in said self-refresh mode,
    self-refresh mode control signal detecting means for detecting said self-refresh mode control signal, and
    block selecting means responsive to detection of said self-refresh mode control signal for generating a block selecting signal for sequentially selecting second predetermined ones of said plurality of memory array blocks,
    said first predetermined ones of said memory array blocks including at least as many memory array blocks as said second predetermined ones of said memory array blocks,
    said refreshing means refreshing data stored in said second ones of said plurality of memory array blocks in response to the block selecting signal from said block selecting means.

2. The dynamic random access memory device according to claim 1, wherein said refresh address generating means and said block selecting means include an address counter,
    said address counter outputting a signal having a plurality of bits as said refresh address signal,
    said address counter outputting a signal of bits added to said refresh address signal to form said block selecting signal in response to detection of said self-refresh mode.

3. A dynamic random access memory device having a self-refresh mode in which a periodic refresh operation is automatically initiated, in addition to an ordinary refresh mode in which a predetermined refresh operation is performed in response to an externally applied refresh request signal, comprising:
    a first plurality of two or more memory array blocks each comprising a memory cell for storing a data signal,
    refresh address generating means for generating a refresh address signal for sequentially selecting the memory cells in said memory array blocks one cell at a time to be refreshed,
    first refreshing means connected to said refresh address generating means and responsive to said refresh address signal for refreshing data stored in a second plurality of memory array blocks including a first predetermined number of said first plurality of memory array blocks in response to said refresh request signal;
    means for receiving a control signal for operating said memory device in said self-refresh mode;
    block selecting means responsive to said self-refresh mode control signal for outputting a block selecting signal for selecting a third plurality of memory array blocks including a second predetermined number of said memory array blocks wherein said first predetermined number is equal to at least said second predetermined number; and
    second refreshing means connected to said refresh address generating means and connected to said block selecting means, said second refreshing means responsive to said refresh address signal for sequentially refreshing data stored in said memory array blocks selected by said block selecting signal in every one of said memory array blocks.

4. The dynamic random access memory according to claim 3, wherein said refresh address generating means and said block selecting means are comprised by an address counter,
    said address counter outputting a signal having a plurality of bits forming said refresh address signal,
    said address counter outputting a signal including a plurality of bits which are appended to said refresh address signal to form said block selecting signal in response to detection of said self-refresh mode control signal.

5. The dynamic random access memory device according to claim 3, wherein
    said block selecting means comprises means for partitioning said first plurality of memory array blocks into a plurality of equal sized blocks, each of said equal sized blocks including a third number of memory array blocks, said third number equal to or less than said second number.

6. The dynamic random access memory device according to claim 5, wherein
    said equally partitioning means and said refresh address generating means constitute a clock signal generating apparatus for generating a clock signal as said block selecting signal and said refresh address signal.

7. The dynamic random access memory device according to claim 6, wherein said clock signal generating apparatus comprises
    timer means for generating a pulse signal for each predetermined time interval, and
    counter means connected to said timer means for counting said pulse signal, to output said clock signal.

8. The dynamic random access memory device according to claim 3, wherein each of said memory array blocks comprises
    a memory array comprising said memory cell,
    decoder means connected to said memory array for decoding the signal from said refresh address generating means, to select a memory cell, and
    sense amplifier means connected to said memory array for amplifying a data signal stored in the memory cell selected by said decoder means,
    said refresh operation comprising an operation for storing again the amplified data signal in the memory cell selected by said decoder means.

9. The dynamic, random access memory device according to claim 8, wherein said second refreshing means comprises
selectively driving means responsive to said block selecting signal for selectively driving a pair of said decoder means and said sense amplifier means.

10. The dynamic random access memory device according to claim 3, wherein
the signal for designating said self-refresh mode comprises a RAS (row address strobe) signal and a CAS (column address strobe) signal which are externally applied and changed at first particular timings, and
said self-refresh mode detecting means comprises means for detecting the changes in said RAS signal and said CAS signal at said particular timings.

11. The dynamic random access memory device according to claim 3, wherein
said refresh request signal comprises a RAS signal and a CAS signal which are externally applied and changed at second particular timings,
said second particular timings comprise the change in logic of said CAS signal before said RAS signal, and
said ordinary refresh mode comprises a CAS before RAS refresh mode.

12. The dynamic random access memory device according to claim 3, wherein
said plurality comprises thirty-two,
said first predetermined number is equal to four, and
said second predetermined number is equal to one.

13. A method for operating a dynamic random access memory device having a self-refresh mode in which a periodic refresh operation is automatically initiated, in addition to an ordinary refresh mode in which a predetermined refresh operation is performed in response to a fresh request signal externally applied, which comprises a first plurality of memory array blocks each comprising a memory cell for storing a data signal, comprising the steps of:
generating a refresh address signal for sequentially selecting memory cells in said memory array block,
refreshing data signals in a second plurality of memory array blocks included in said first plurality of memory array blocks in response to said refresh address signal when said refresh request signal is externally applied,
receiving an external self-refresh control signal for operating said dynamic random access memory device in said self-refresh mode,
detecting said self-refresh mode control signal,
outputting a block selecting signal for sequentially selecting a third plurality of memory array blocks included in said first plurality of memory array blocks in.response to detection of said self-refresh mode control signal,
said third plurality including a number of memory array blocks equal to or less than a number of memory array blocks included in said second plurality of memory array blocks, and
sequentially refreshing data stored in said memory array blocks selected by said block selecting signal in response to said refresh address signal.

14. A dynamic random access memory device having a self-refresh mode in which a periodical refresh operation is automatically initiated, in addition to an ordinary refresh mode in which a predetermined refresh operation is performed in response to a refresh request signal externally applied, comprising:
a memory array comprising memory cells each storing a data signal,
refresh address generating means connected to said memory array for generating a refresh address signal for sequentially selecting the memory cells in said memory array to be refreshed,
refreshing means connected to said refresh address generating means and responsive to said refresh address signal for refreshing the data signals stored in said memory cells in said memory array at a predetermined time interval,
means for receiving an external control signal for operating said memory device in said self-refresh mode,
self-refresh mode detecting means for detecting said self-refresh mode control signal, and
interval setting means connected to said refreshing means and responsive to said self-refresh mode detecting means for controlling said predetermined time interval.

15. The dynamic random access memory device according to claim 14, which is formed on a semiconductor substrate and wherein each of said memory cells comprises
switching means formed on said semiconductor substrate,
an insulating layer joined to said semiconductor substrate,
capacitance means provided on said semiconductor substrate through said insulating layer,
said capacitance means having one electrode, another electrode and dielectric means formed between said one electrode and said other electrode,
said one electrode being joined to said insulating layer, and
connecting means formed between said switching means and said one electrode in said capacitance means for electrically connecting one end of said one electrode in said capacitance means to said switching means.

16. The dynamic random access memory device according to claim 15, wherein
said switching means in each of said memory cells comprises a field effect transistor having one electrode and another electrode,
said one electrode and said other electrode in said field effect transistor being formed in said semiconductor substrate, and
said connecting means comprises means for connecting one end of one electrode in said capacitance means to either one of one electrode and the other electrode in said field effect transistor.

17. The dynamic random access memory device according to claim 14 wherein said interval setting means comprises partial activation means responsive to the refresh address signal for selectively activating predetermined portions of said refreshing means.

18. The dynamic random access memory device according to claim 17 wherein said refresh means comprises
word line driving means connected to said refresh address generating means responsive to the refresh address signal for driving word lines connected to the memory cells, and
amplifier means for amplifying data signal stored in the memory cells, said partial activation means selectively activating predetermined portions of said word line driving means and amplifier means, respectively.

19. The dynamic random access memory device according to claim 18, further comprising:
word line selecting means responsive to the refresh address signal for selecting word lines to be driven by said word line driving means,
said partial activation means selectively activating predetermined portions of said word line selecting means in response to the refresh address signal.

* * * * *